(12) United States Patent
Tsai et al.

(10) Patent No.: US 11,233,140 B2
(45) Date of Patent: Jan. 25, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chun Hsiung Tsai, Xinpu Township (TW); Clement Hsingjen Wann, Carmel, NY (US); Kuo-Feng Yu, Zhudong Township (TW); Yi-Tang Lin, Hsinchu (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/856,842

(22) Filed: Apr. 23, 2020

(65) Prior Publication Data
US 2020/0343373 A1 Oct. 29, 2020

Related U.S. Application Data

(63) Continuation-in-part of application No. 16/731,767, filed on Dec. 31, 2019.
(Continued)

(51) Int. Cl.
*H01L 29/78* (2006.01)
*H01L 21/762* (2006.01)
(Continued)

(52) U.S. Cl.
CPC .. *H01L 29/66818* (2013.01); *H01L 21/76224* (2013.01); *H01L 21/823431* (2013.01);
(Continued)

(58) Field of Classification Search
CPC ......... H01L 29/66818; H01L 29/41791; H01L 29/7851; H01L 21/823431; H01L 29/0649;
(Continued)

(56) References Cited

U.S. PATENT DOCUMENTS 8,492,838 B2 7/2013 Dennard et al.
9,324,846 B1 4/2016 Camillo-Castillo et al.
(Continued)

FOREIGN PATENT DOCUMENTS

CN 111834227 A * 10/2020
JP 2000-12858 A 1/2000
(Continued)

OTHER PUBLICATIONS

Office Action issued in corresponding Korean Application No. 10-2020-0048790, dated Sep. 30, 2021.
(Continued)

*Primary Examiner* — Earl N Taylor
(74) *Attorney, Agent, or Firm* — McDermott Will & Emery LLP

(57) ABSTRACT

In a method of manufacturing a semiconductor device including a field effect transistor (FET), a sacrificial region is formed in a substrate, and a trench is formed in the substrate. A part of the sacrificial region is exposed in the trench. A space is formed by at least partially etching the sacrificial region, an isolation insulating layer is formed in the trench and the space, and a gate structure and a source/drain region are formed. An air spacer is formed in the space under the source/drain region.

20 Claims, 31 Drawing Sheets

Related U.S. Application Data

(60) Provisional application No. 62/837,519, filed on Apr. 23, 2019, provisional application No. 62/955,865, filed on Dec. 31, 2019.

(51) Int. Cl.
  *H01L 29/66* (2006.01)
  *H01L 21/8234* (2006.01)
  *H01L 29/417* (2006.01)
  *H01L 29/06* (2006.01)
  *H01L 29/423* (2006.01)

(52) U.S. Cl.
  CPC ...... *H01L 29/0649* (2013.01); *H01L 29/0673* (2013.01); *H01L 29/41791* (2013.01); *H01L 29/42392* (2013.01); *H01L 29/66795* (2013.01); *H01L 29/785* (2013.01); *H01L 29/7851* (2013.01)

(58) Field of Classification Search
  CPC ........... H01L 29/0673; H01L 29/42392; H01L 29/785; H01L 29/66795
  See application file for complete search history.

(56) References Cited

U.S. PATENT DOCUMENTS

| | | | |
|---|---|---|---|
| 9,608,059 B2* | 3/2017 | Cappellani | B82Y 10/00 |
| 9,954,107 B2* | 4/2018 | Cheng | H01L 29/1054 |
| 9,984,936 B1* | 5/2018 | Xie | B82Y 10/00 |
| 10,026,829 B2* | 7/2018 | Cappellani | H01L 27/1203 |
| 10,056,289 B1 | 8/2018 | Cheng et al. | |
| 10,074,575 B1* | 9/2018 | Guillorn | H01L 29/66545 |
| 10,134,640 B1* | 11/2018 | Chiang | H01L 21/823878 |
| 10,164,041 B1* | 12/2018 | Xie | H01L 29/4991 |
| 10,332,803 B1* | 6/2019 | Xie | H01L 27/0924 |
| 10,464,041 B2 | 11/2019 | Lambert et al. | |
| 10,665,669 B1* | 5/2020 | Xie | H01L 29/42392 |
| 10,680,083 B2* | 6/2020 | Bao | H01L 29/66795 |
| 10,840,329 B1* | 11/2020 | Xie | H01L 29/0653 |
| 10,943,830 B2 | 3/2021 | Chiang et al. | |
| 2002/0072206 A1 | 6/2002 | Chen et al. | |
| 2002/0181787 A1 | 12/2002 | Ito et al. | |
| 2002/0182787 A1 | 12/2002 | Bae | |
| 2003/0173617 A1 | 9/2003 | Sato et al. | |
| 2004/0217434 A1 | 11/2004 | Lee et al. | |
| 2009/0278196 A1* | 11/2009 | Chang | H01L 29/0653 257/328 |
| 2010/0187657 A1 | 7/2010 | Boeck et al. | |
| 2010/0219450 A1 | 9/2010 | Kim et al. | |
| 2012/0074465 A1 | 3/2012 | Chen et al. | |
| 2012/0098039 A1 | 4/2012 | Miu et al. | |
| 2012/0292700 A1 | 11/2012 | Khakifirooz et al. | |
| 2013/0320455 A1* | 12/2013 | Cappellani | H01L 29/66795 257/368 |
| 2014/0151852 A1 | 6/2014 | Adkisson et al. | |
| 2014/0327111 A1 | 11/2014 | Camillo-Castillo et al. | |
| 2014/0353725 A1 | 12/2014 | Adkisson et al. | |
| 2015/0060950 A1 | 3/2015 | Camillo-Castillo et al. | |
| 2015/0108430 A1 | 4/2015 | Cheng et al. | |
| 2015/0137185 A1 | 5/2015 | Camillo-Castillo et al. | |
| 2015/0348825 A1 | 12/2015 | Hebert | |
| 2016/0027727 A1 | 1/2016 | Kim et al. | |
| 2018/0108675 A1 | 4/2018 | Schmidt et al. | |
| 2018/0166327 A1 | 6/2018 | Hsiao et al. | |
| 2019/0013382 A1 | 1/2019 | Stamper et al. | |
| 2020/0006331 A1* | 1/2020 | Lilak | H01L 29/66795 |
| 2020/0152734 A1* | 5/2020 | Frougier | H01L 29/0673 |
| 2020/0335583 A1* | 10/2020 | Sun | H01L 21/67103 |
| 2020/0343373 A1* | 10/2020 | Tsai | H01L 21/823431 |
| 2020/0357884 A1* | 11/2020 | Xie | H01L 29/0649 |
| 2020/0357911 A1* | 11/2020 | Frougier | H01L 29/165 |
| 2020/0365467 A1* | 11/2020 | Cheng | H01L 29/0673 |
| 2020/0365584 A1* | 11/2020 | Ando | H01L 29/0649 |
| 2020/0395237 A1 | 12/2020 | Lin et al. | |

FOREIGN PATENT DOCUMENTS

| | | |
|---|---|---|
| JP | 4670524 B2 | 4/2011 |
| KR | 10-2001-0036815 A | 5/2001 |
| KR | 10-2004-0094498 A | 11/2004 |
| KR | 10-2010-0099047 A | 9/2010 |
| KR | 10-2018-0068844 A | 6/2018 |
| TW | 201248855 A | 12/2012 |
| TW | 201816935 A | 5/2018 |
| TW | 201841207 A | 11/2018 |
| TW | 201913878 A | 4/2019 |

OTHER PUBLICATIONS

Non-Final Office Action issued in U.S. Appl. No. 16/856,817, dated Jul. 22, 2021.
Non-Final Office Action issued in U.S. Appl. No. 16/731,767, dated Jul. 22, 2021.

* cited by examiner

SEMICONDUCTOR DEVICE AND MANUFACTURING METHOD THEREOF

RELATED APPLICATIONS

This application claims priority to U.S. Provisional Patent Application No. 62/837,519 filed on Apr. 23, 2019 and priority to U.S. Provisional Patent Application No. 62/955,865 filed Dec. 31, 2019, and is a continuation-in-part of application Ser. No. 16/731,767 filed on Dec. 31, 2019, which claims priority to U.S. Provisional Patent Application No. 62/837,519 filed on Apr. 23, 2019, the entire contents each of which are incorporated herein by reference.

BACKGROUND

In order to reduce power consumption in a semiconductor device, reducing parasitic capacitance is one of the key technologies. Existing planer complementary metal oxide semiconductor field effect transistors (CMOS FETs) have diffused source/drains (S/D) that induce parasitic capacitance between the S/D region and the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 32A, 32B, 32C, 32D and 32E show cross sectional views of the various stages of a manufacturing operation for a semiconductor device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to a planar FET but also other FETs, such as a fin FET and a gate-all-around FET.

Figure 1A:
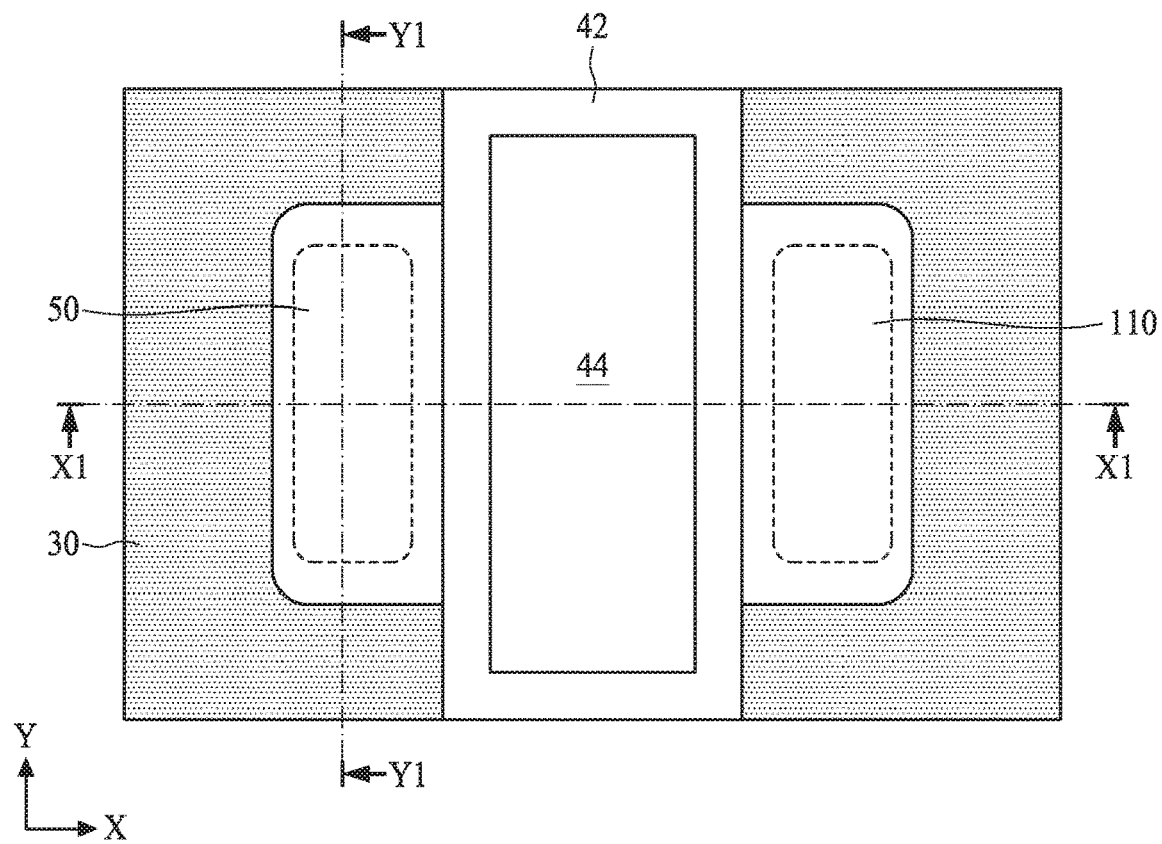
FIG. 1A shows a plan view and FIGS. 1B, 1C, 1D and 1E show cross sectional views of a semiconductor device according to embodiments of the present disclosure.
Figure 1B:
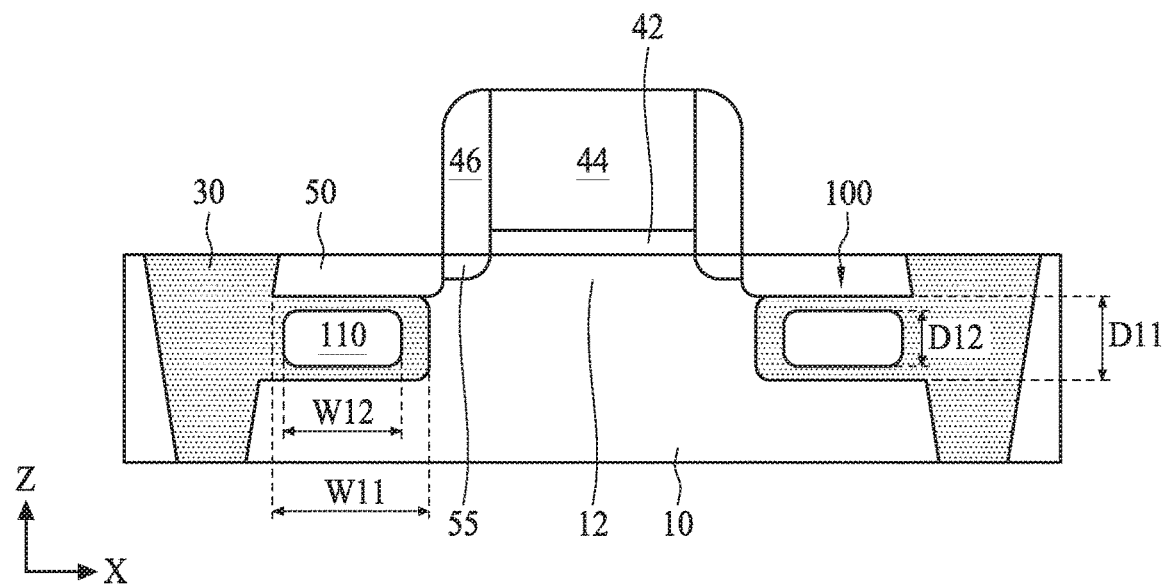

FIG. 1A shows a plan view, FIG. 1B shows a cross sectional view corresponding to line X1-X1 (along the X, i.e., source-to-drain, direction) of FIG. 1A, and FIGS. 1C, 1D and 1E show cross sectional views corresponding to line Y1-Y1 (along the Y, i.e., gate extending, direction) of FIG. 1A of a semiconductor device according to embodiments of the present disclosure.

As shown, an FET is formed over a substrate 10. The FET includes a gate dielectric layer 42 disposed over a channel region 12 of the substrate 10 and a gate electrode layer 44. Gate sidewall spacers 46 are disposed on opposing side faces of the gate electrode layer 44.

The substrate 10 is, for example, a p-type silicon or germanium substrate with an impurity concentration in a range from about $1\times10^{15}$ cm$^{-3}$ to about $1\times10^{16}$ cm$^{-3}$. In some embodiments, a p+ silicon substrate is used. In other embodiments, the substrate is an n-type silicon or germanium substrate with an impurity concentration in a range from about $1\times10^{15}$ cm$^{-3}$ to about $1\times10^{16}$ cm$^{-3}$.

Alternatively, the substrate 10 may comprise another elementary semiconductor, such as germanium; a compound semiconductor including Group IV-IV compound semiconductors such as SiC, SiGe and SiGeSn, or combinations thereof. In one embodiment, the substrate 10 is a silicon layer of an SOI (silicon-on insulator) substrate. The substrate 10 may include various regions that have been suitably doped with impurities (e.g., p-type or n-type conductivity).

The gate dielectric layer 42 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 20 nm in some embodiments, and may be in a range from about 2 nm to about 10 nm in other embodiments.

The gate electrode layer 44 includes one or more conductive layers. In some embodiments, the gate electrode layer 44 is made of doped poly silicon. In other embodiments, the gate electrode layer 44 includes metallic material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate length (along the X direction) is in a range from about 20 nm to about 200 nm and is in a range from about 40 nm to about 100 nm in other embodiments.

In certain embodiments of the present disclosure, one or more work function adjustment layers are interposed between the gate dielectric layer 42 and a body metal gate electrode 44. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, Hifi, TiSi and TaSi is used as the work function adjustment layer, and for a p-channel FET, one or more of TiAlC, Al, TiAl, TaN, TaAlC, TiN, TiC and Co is used as the work function adjustment layer. When metallic materials are used as the gate electrode layer, a gate replacement technology is employed to fabricate the gate structure.

The gate sidewall spacers 46 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 46 are formed by forming a blanket layer of insulating material over the gate electrode layer 44 and performing anisotropic etching. In one embodiment, the sidewall spacer layers are made of silicon nitride based material, such as SiN, SiON, SiOCN or SiCN.

Figure 1C:
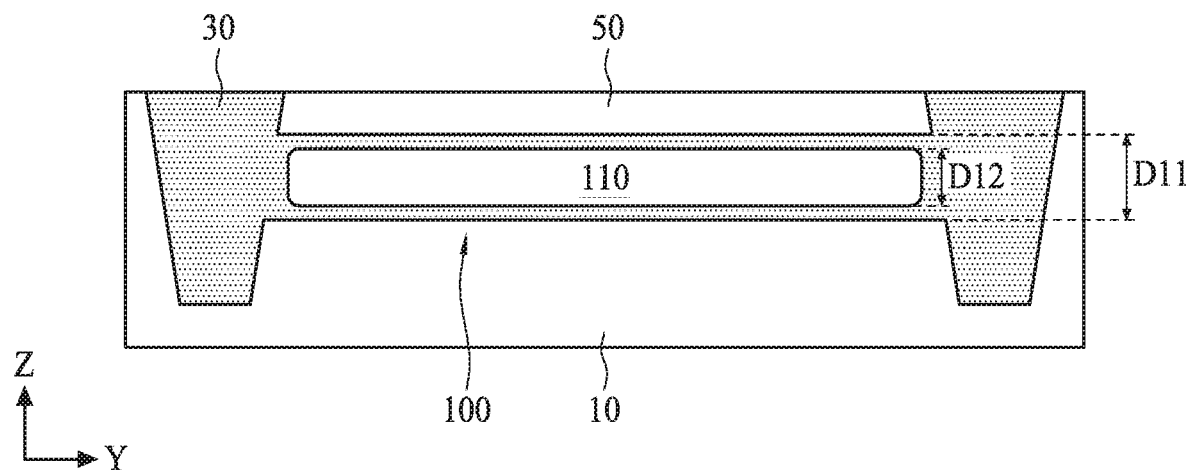

The FET shown in FIGS. 1A-1C also includes source/drain diffusion regions 50 and source/drain extension regions 55. The source/drain diffusion regions 50 are n+ or p+ regions formed by, for example, one or more ion implant operations or thermal diffusion operations. The source/drain extension regions 55 are n, n-, p or p- regions formed by, for example, one or more pocket implantations. The source/drain extension regions 55 are formed under the gate sidewall spacers 46, as shown in FIG. 1B. In some embodiments, the source/drain diffusion regions 50 include one or more epitaxial semiconductor layers, which form a raised source/drain structure.

The FET shown in FIGS. 1A-1C further includes isolation insulating regions 30, which are also referred to as shallow trench isolation (STI) regions to electrically separate the FET from other electric devices formed on the substrate 10. The isolation insulating regions 30 include one or more silicon-based insulating layers in some embodiments.

The FET shown in FIGS. 1A-1C includes air spacers (air gaps) 110 in spaces 100 having a rectangular cross section under the source/drain diffusion regions 50. The air spacers 110 are enclosed by the insulating material forming the isolation insulating region 30 in some embodiments. The air spacers 110 can eliminate or suppress junction capacitance between the source/drain diffusion regions 50 and the substrate 10. In some embodiments, no air spacer is disposed below the channel region.

In some embodiments, the width W11 in the X direction of the space 100 is in a range from about 100 nm to about 500 nm, and is in a range from about 200 nm to about 400 nm in other embodiments. A ratio of the width W12 in the X direction of the air spacer 110 to the width W11 (W12/W11) is in a range from 0.5 to about 0.95 in some embodiments, and is in a range from about 0.7 to 0.9 in other embodiments.

In some embodiments, the depth D11 in the Z direction of the space 100 is in a range from about 10 nm to about 200 nm, and is in a range from about 30 nm to about 100 nm in other embodiments. A ratio of the depth D12 in the Z direction of the air spacer 110 to the depth D11 of the space 100 (D12/D11) is in a range from about 0.5 to about 0.9 in some embodiments, and is in a range from about 0.6 to about 0.8 in other embodiments. An aspect ratio of the width W11 of the space 100 to the depth D11 (W11/D11) of the space 100 is in a range from about 1 to about 10 in some embodiments, and is in a range from about 2 to about 5 in other embodiments.

In some embodiments, an aspect ratio (W11/D11) of the space 100 is in a range from about 2 to about 10 and is in a range from about 3 to about 8 in other embodiments. In some embodiments, an aspect ratio (W12/D12) of the air spacer 110 is in a range from about 2 to about 10 and is in a range from about 3 to about 8 in other embodiments.

Figure 1D:
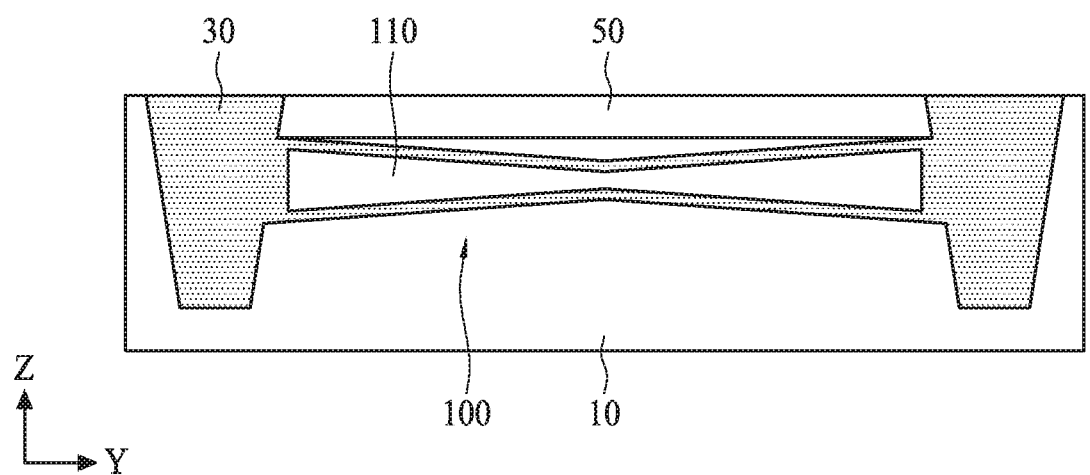
Figure 1E:
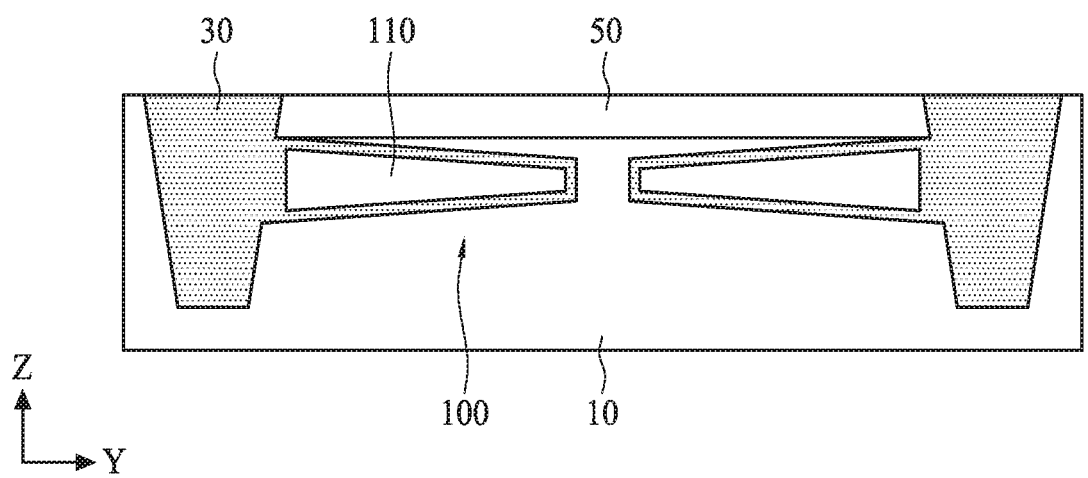

As shown in FIG. 1C, the space 100 and/or the air spacer 110 are continuously disposed along the Y direction under the source/drain diffusion region 50 with a substantially constant depth D12. In other embodiments, the space 100 and/or the air spacer 110 are discontinuous along the Y direction. In some embodiments, the depth D11 of the space 100 and/or the depth D12 of the air spacer 110 become smaller as a distance from the isolation insulating region 30 toward the center portion increases as shown in FIG. 1D. In some embodiments, two spaces 100 formed from the left side and from the right side do not meet, and are separated by a part of the substrate 10, as shown in FIG. 1E.

Figure 2A:
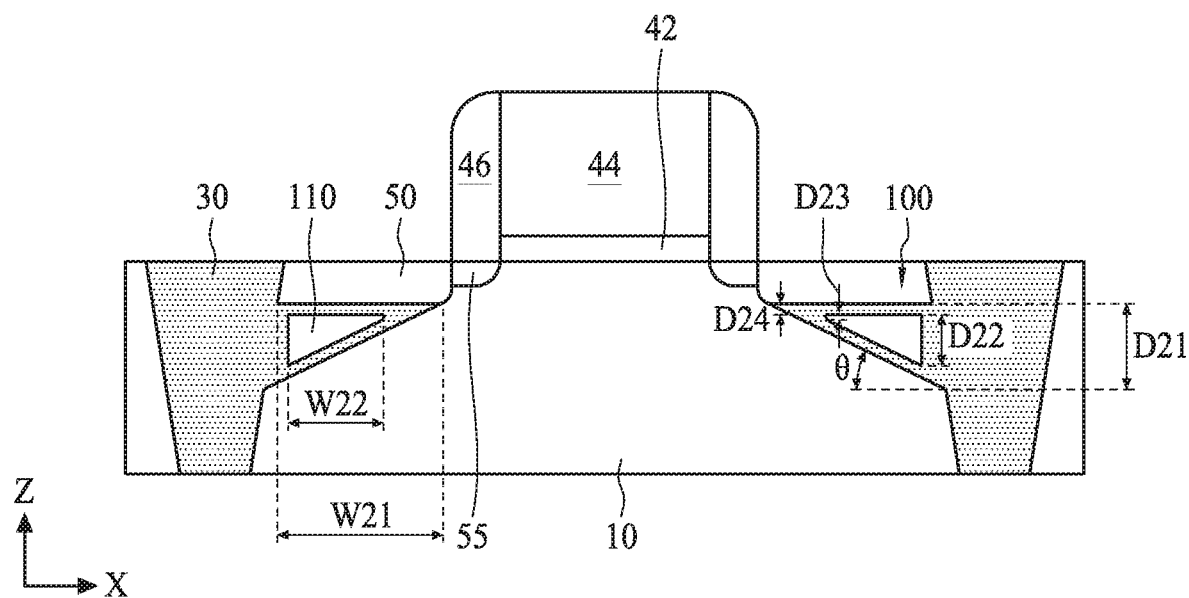
FIGS. 2A, 2B and 2C show cross sectional views of a semiconductor device according to embodiments of the present disclosure.
Figure 2B:
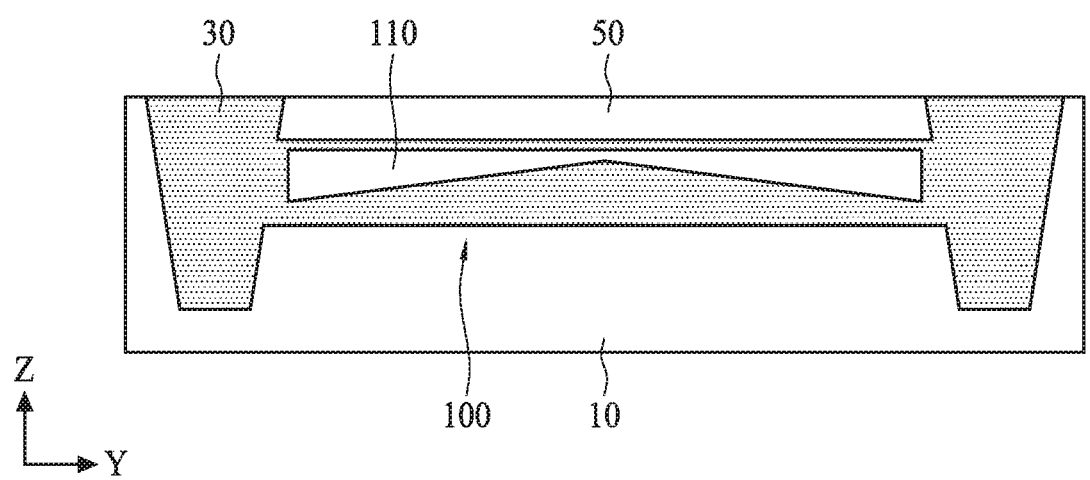
Figure 2C:
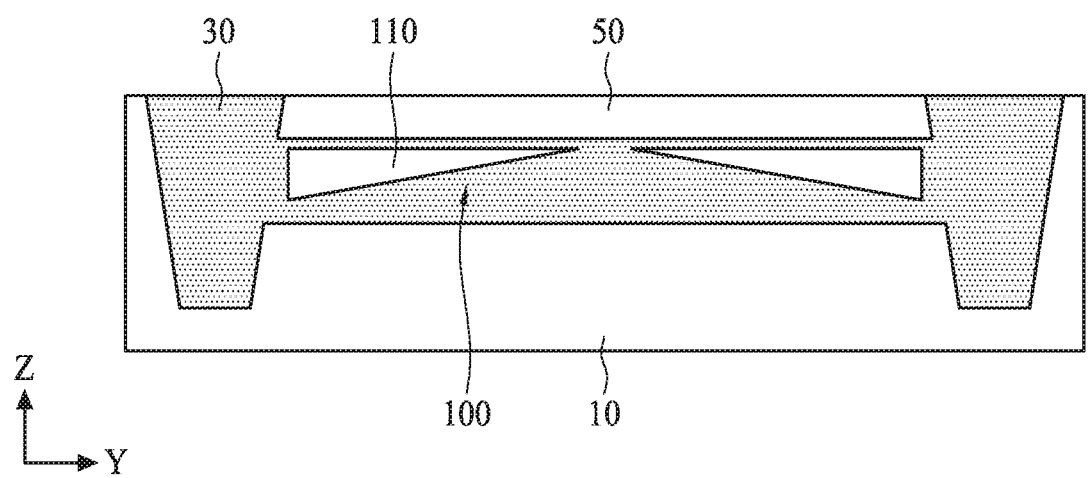

FIG. 2A shows a cross sectional view corresponding to line X1-X1 (along the X, i.e., source-to-drain, direction) of FIG. 1A, and FIGS. 2B and 2C show a cross sectional view corresponding to line Y1-Y1 (along the Y, i.e., gate extending, direction) of FIG. 1A of a semiconductor device according to embodiments of the present disclosure. Materials, configurations, dimensions, processes and/or operations same as or similar to those described with the foregoing embodiments may be employed in the following embodiments and the detailed explanation may be omitted.

In embodiments shown in FIGS. 2A-2C, the space 100 and the air spacer 110 have a triangular shape or a trapezoid shape.

In some embodiments, the width W21 in the X direction of the space 100 is in a range from about 100 nm to about 500 nm, and is in a range from about 200 nm to about 400 nm in other embodiments. A ratio of the width W22 in the X direction of the air spacer 110 to the width W21 (W22/W21) is in a range from about 0.5 to about 0.95 in some embodiments, and is in a range from about 0.7 to about 0.9 in other embodiments.

In some embodiments, the depth D21 in the Z direction of the space 100 at the entrance of the space 100 (an edge of the isolation insulating layer 30) is in a range from about 10 nm to about 200 nm, and is in a range from about 30 nm to about 100 nm in other embodiments. A ratio of the largest depth D22 in the Z direction of the air spacer 110 to the depth D21 of the space 100 (D22/D21) is in a range from about 0.5 to about 0.9 in some embodiments, and is in a range from about 0.6 to 0.8 in other embodiments. In some embodiments, a ratio of the smallest depth D23 in the Z direction of the air spacer 110 to the largest depth D22 (D23/D22) of the air spacer 110 is in a range from about 0.1 to about 0.9 in some embodiments, and is in a range from about 0.4 to about 0.8 in other embodiments. A ratio of the width W21 of the space 100 to the largest depth D2 of the space 100 (W21/D21) is in a range from about 1 to about 10 in some embodiments, and is in a range from about 2 to about 5 in other embodiments. In some embodiments, a ratio of the smallest depth D24 in the Z direction of the space 100 to the largest depth D21 (D24/D21) of the space 100 is in a range from about 0 to about 0.8 in some embodiments, and is in a range from about 0.4 to about 0.6 in other embodiments.

In some embodiments, the angle θ between the bottom face of the space 100 and the horizontal line (parallel to the upper surface of the substrate 10) is more than 0 degrees to 60 degrees or less. In other embodiments, the angle θ is in a range from about 15 degrees to 45 degrees.

As shown in FIG. 2B, the space 100 and/or the air spacer 110 are continuously disposed along the Y direction under the source/drain diffusion region 50. In some embodiments, the depth D11 of the space 100 and/or the depth of the air spacer 110 become smaller as a distance from the isolation insulating region 30 toward the center portion of the source/drain region 50 increases, as shown in FIG. 2B. In other embodiments, the space 100 and/or the air spacer 110 are discontinuous along the Y direction as shown in FIG. 2C.

FIGS. 3-12 show cross sectional views of various stages for manufacturing a FET device according to an embodiment of the present disclosure. It is understood that additional operations can be provided before, during, and after processes shown by FIGS. 3-12, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted.

Figure 3:
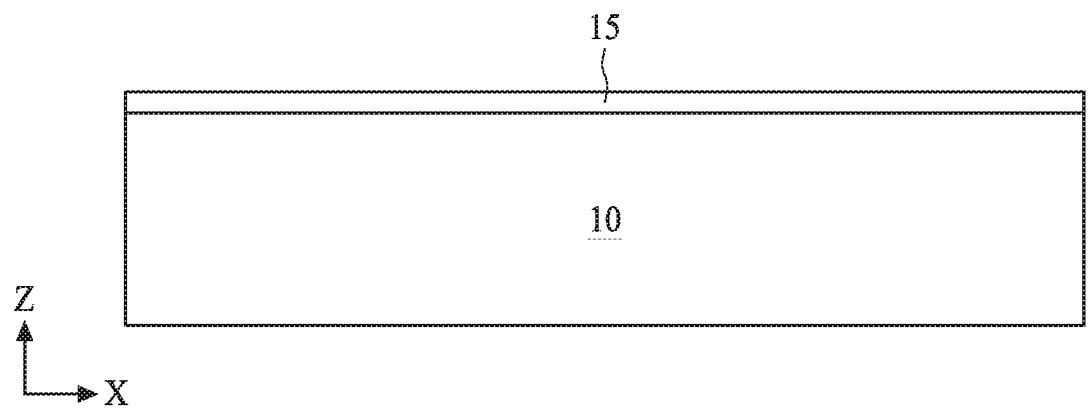
FIG. 3 shows a cross sectional view of one of the various stages of a manufacturing operation for a semiconductor device according to an embodiment of the present disclosure.

As shown in FIG. 3, a cover layer 15 is formed over the substrate 10. The cover layer 15 includes a single silicon oxide layer. In other embodiments, the cover layer 15 includes a silicon oxide layer and a silicon nitride layer formed on the silicon oxide layer. The silicon oxide layer can be formed by using thermal oxidation or a CVD process. The CVD process includes plasma-enhanced chemical vapor deposition (PECVD), an atmospheric pressure chemical vapor deposition (APCVD), a low-pressure CVD (LPCVD), and a high density plasma CVD (HDPCVD). An atomic layer deposition (ALD) may also be used. The thickness of the cover layer 15 is in a range from about 5 nm to about 50 nm in some embodiments, and is in a range from about 10 nm to about 30 nm in other embodiments.

In some embodiments, before or after the cover layer 15 is formed, one or more alignment key patterns are formed on the substrate 10.

Figure 4:
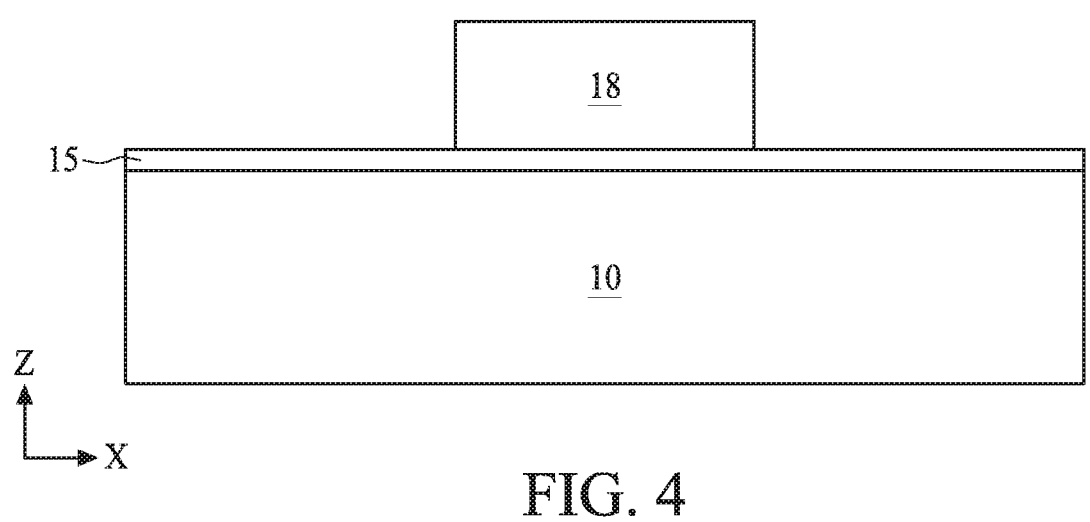
FIG. 4 shows a cross sectional view of one of the various stages of a manufacturing operation for a semiconductor device according to an embodiment of the present disclosure.

By using one or more lithography operations, a photo resist pattern as a first mask pattern 18 is formed over the cover layer 15 as shown in FIG. 4. The width and location of the first mask pattern 18 is substantially the same as the width and location of a gate electrode subsequently formed. The lithography operation is performed using the alignment key patterns formed on the substrate 10 in some embodiments. In some embodiments, the thickness of the photo resist pattern 18 is in a range from about 100 nm to 1000 nm.

Figure 5:
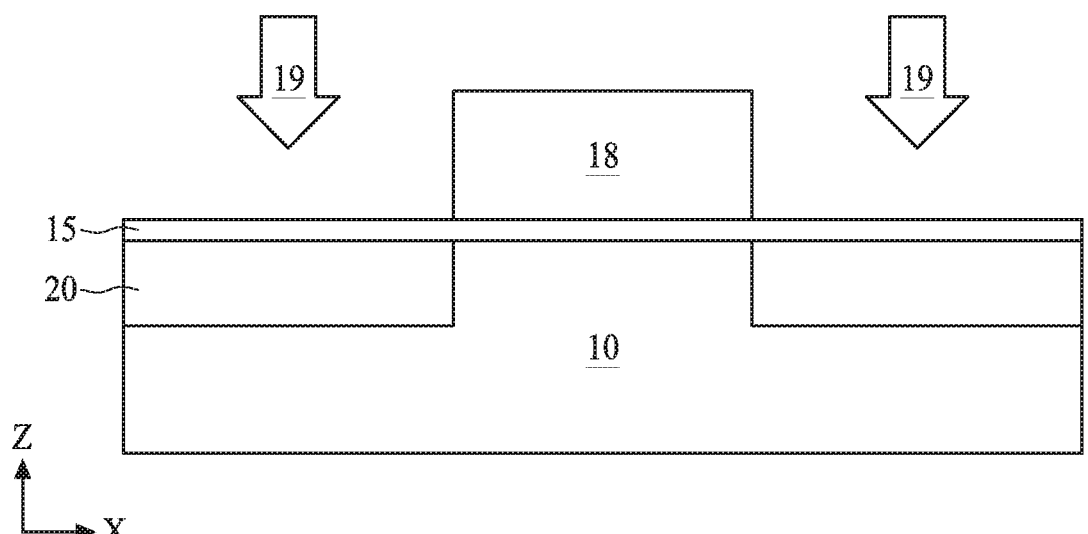
FIG. 5 shows a cross sectional view of one of the various stages of a manufacturing operation for a semiconductor device according to an embodiment of the present disclosure.

After the first mask pattern 18 is formed, one or more ion implantation operations 19 are performed to form sacrificial regions 20 containing dopants as shown in FIG. 5. In some embodiments, ions of arsenic (As) are implanted (doped) into the substrate 10. Ions of other dopant elements, such as P, As, Sb, Ge, N and/or C may also be used. In some embodiments, an acceleration voltage of the ion implantation 19 is in a range from about 0.5 keV to about 10 keV, and is in a range from about 2 keV to about 8 keV in other embodiments. A dose amount of the ions is in a range from about $5\times10^{13}$ ions/cm$^2$ to about $5\times10^{15}$ ions/cm$^2$ in some embodiments, and is in a range from about $1\times10^{14}$ ions/cm$^2$ to about $1\times10^{15}$ ions/cm$^2$ in other embodiments. The sacrificial regions 20 have a depth in a range from about 5 nm to about 80 nm in some embodiments, and the depth is in a range from about 20 nm to about 50 nm in other embodiments.

Figure 6:
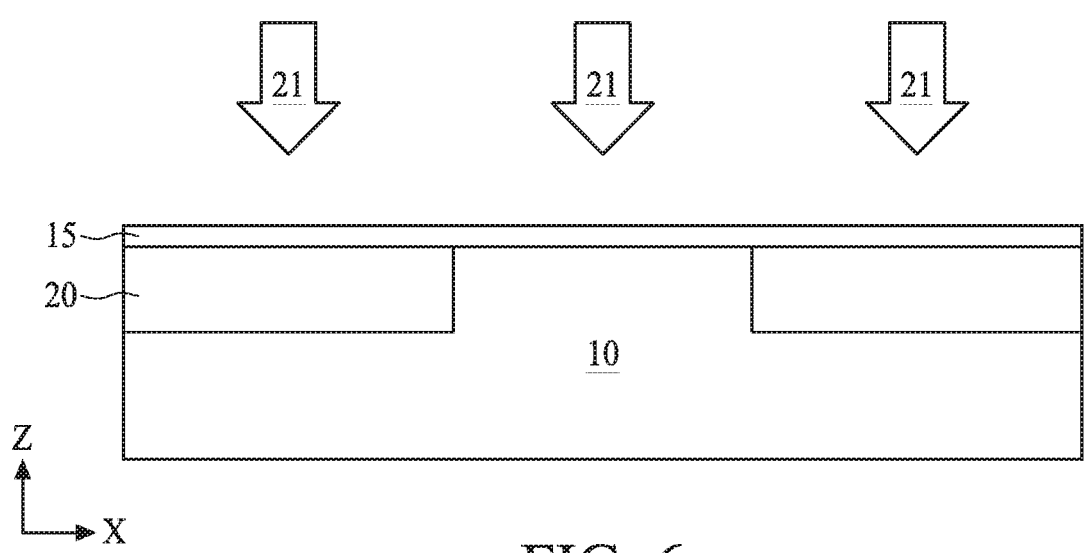
FIG. 6 shows a cross sectional view of one of the various stages of a manufacturing operation for a semiconductor device according to an embodiment of the present disclosure.

In some embodiments, after the ion implantation operations and removal of the mask layer 18, a thermal process 21, for example, an anneal process, is performed as shown in FIG. 6. In certain embodiments, the thermal process is performed by using rapid thermal annealing (RTA) 21 at a temperature in a range from about 900° C. to about 1050° C. for about 1 second to about 10 seconds in an inert gas ambient, such as an N$_2$, Ar or He ambient.

In some embodiments, an impurity concentration of the sacrificial layer 20 is in a range from about $1\times10^{19}$ atoms/cm$^3$ to about $5\times10^{21}$ atoms/cm$^3$, and is in a range from about $1\times10^{20}$ atoms/cm$^3$ to about $1\times10^{21}$ atoms/cm$^3$ in other embodiments.

After the annealing operation 21, the cover layer 15 is removed by using wet and/or dry etching operations.

Figure 7:
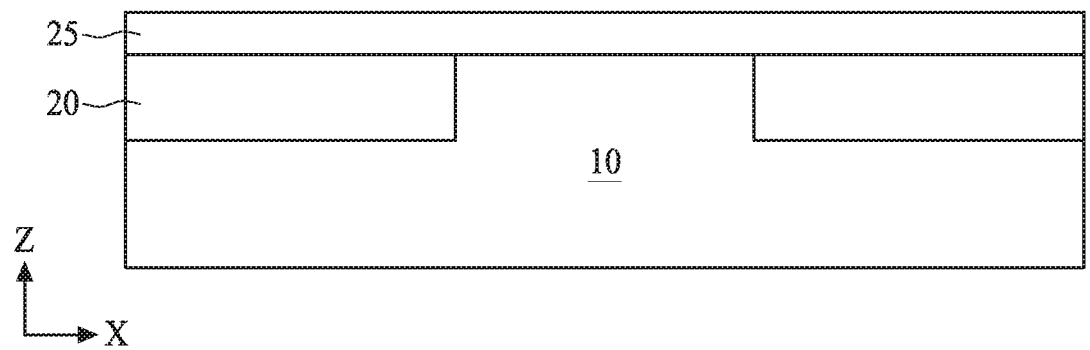
FIG. 7 shows a cross sectional view of one of the various stages of a manufacturing operation for a semiconductor device according to an embodiment of the present disclosure.

Then, as shown in FIG. 7, an epitaxial semiconductor layer 25 is formed over the substrate 10 including the sacrificial layer 20. In some embodiments, the epitaxial semiconductor layer 25 includes one of Si, SiGe and Ge. In certain embodiments, Si is epitaxially formed as the epitaxial semiconductor layer 25. The epitaxial semiconductor layer 25 may be grown at a temperature of about 600 to 800° C. at a pressure of about 5 to 50 Torr, by using a Si containing gas such as SiH$_4$, Si$_2$H$_6$ and/or SiCl$_2$H$_2$. A Ge containing gas, such as GeH$_4$, Ge$_2$H$_6$ and/or GeCl$_2$H$_2$ is used for the cases of SiGe or Ge. In some embodiments, the epitaxial semiconductor layer 25 is doped with n-type or p-type impurities. The thickness of the epitaxial semiconductor layer 25 is in a range from about 5 nm to about 100 nm in some embodiments, and is in a range from about 10 nm to about 30 nm in other embodiments.

Figure 8:
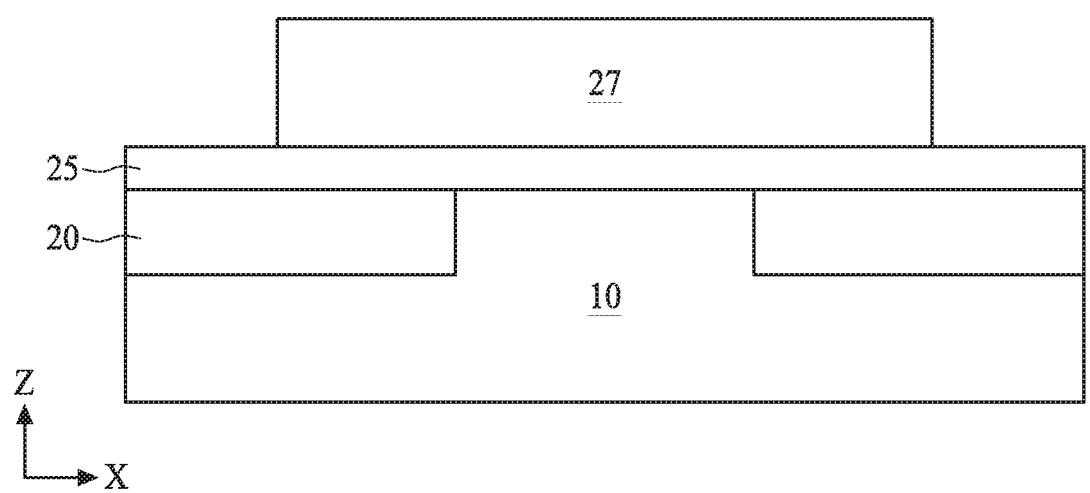
FIG. 8 shows a cross sectional view of one of the various stages of a manufacturing operation for a semiconductor device according to an embodiment of the present disclosure.

A second mask pattern 27 is then formed over the epitaxial semiconductor layer 25 as shown in FIG. 8. In some embodiments, the second mask pattern 27 is a photo resist pattern. In other embodiments, the second mask pattern 27 is a hard mask pattern made of one or more layers of silicon oxide, silicon nitride and SiON. In some embodiments, one or more cover layer is formed between the second mask pattern 27 and the epitaxial semiconductor layer 25. The cover layer is made of silicon oxide, silicon nitride and/or SiON. In certain embodiments, the cover layer includes a silicon oxide layer formed on the epitaxial semiconductor layer 25 and a silicon nitride layer formed on the silicon oxide layer.

Figure 9:
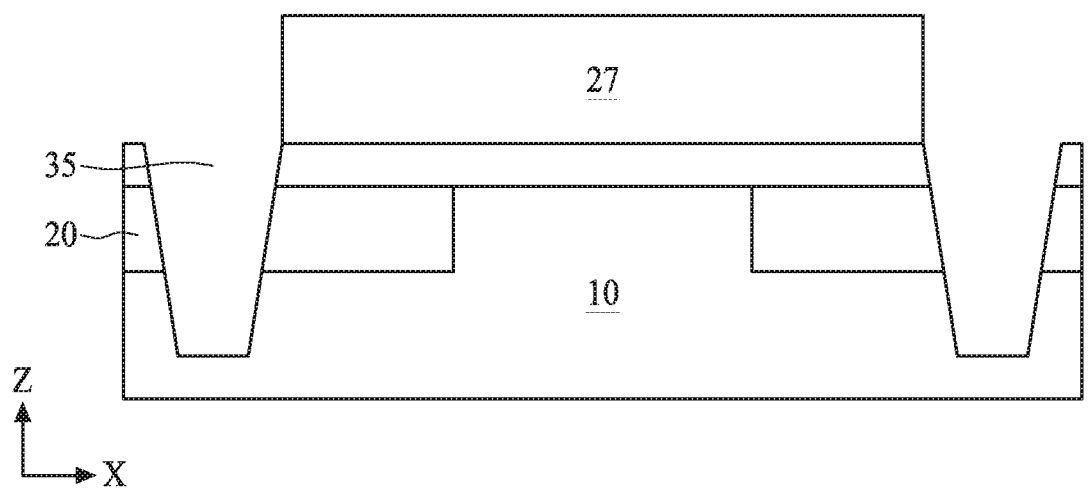
FIG. 9 shows a cross sectional view of one of the various stages of a manufacturing operation for a semiconductor device according to an embodiment of the present disclosure.

Subsequently, trenches 35 are formed by etching the epitaxial semiconductor layer 25, the sacrificial layer 20 and the substrate 10 as shown in FIG. 9. In some embodiments, plasma dry etching is used. In some embodiments, the etching gas includes a halogen containing gas, such as HBr. In some embodiments, the HBr gas is diluted with an inert gas, such as He and/or Ar. In some embodiments, a ratio of the HBr gas to the dilution gas is in a range from about 0.3 to about 0.7, and in other embodiments, the ratio is in a range from about 0.4 to about 0.6. Other gases suitable to etch silicon may be used.

Figure 10:
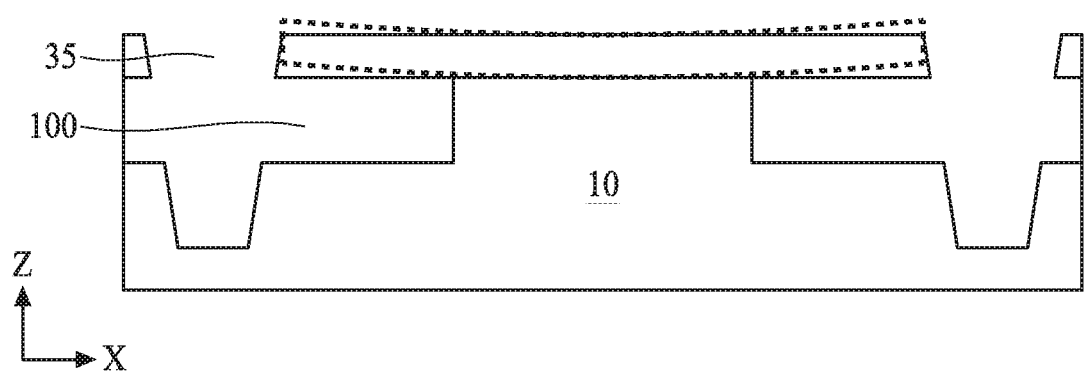
FIG. 10 shows a cross sectional view of one of the various stages of a manufacturing operation for a semiconductor device according to an embodiment of the present disclosure.

Next, as shown in FIG. 10, the sacrificial layer 20 is laterally etched to form spaces 100 as shown in FIG. 10. In some embodiments, plasma dry etching is used. In some embodiments, the etching gas includes a chlorine containing gas, such as HCl, Cl$_2$, CF$_3$Cl, CCl$_4$ or SiCl$_4$. In some embodiments, the chlorine containing gas is diluted with an inert gas, such as He and/or Ar. In some embodiments, a ratio of chlorine containing gas to the dilution gas is in a range from about 0.3 to about 0.7, and in other embodiments, the ratio is in a range from about 0.4 to about 0.6. In some embodiments, one or more additional gas, such as O$_2$, is added. Other gases suitable to etch silicon may be used. In some embodiments, an additional wet etching operation using a tetramethylammonium hydroxide (TMAH) aqueous solution is performed.

The etching of the sacrificial layer 20 containing dopants, such as As, is selective to the silicon substrate 10 and the epitaxial semiconductor layer 25. The etching selectivity is about 10 to about 100 in some embodiments. In some embodiments, the sacrificial layer 20 is substantially fully etched as shown in FIG. 10. In other embodiments, the sacrificial layer 20 is only partially etched, and thus part of the sacrificial layer 20 containing the dopants remains around the space 100. In such a case, an impurity containing layer having a higher dopant concentration than the substrate 10 and/or the epitaxial semiconductor layer 25 is disposed around the space 100.

In some embodiments, after the spaces 100 are formed, end portions of the epitaxial semiconductor layer 25 above the spaces 100 bend upward, forming a concave curved shape as shown by the broken line in FIG. 10. In other embodiments, the end portions of the epitaxial semiconductor layer 25 above the spaces 100 bend downward, forming a convex curved shape.

In some embodiments, less etching gas reaches an end of a long distance in the space, and thus the etching rate becomes smaller as the distance from the trench increases. In such as case, as shown in FIG. 1D, the depth in the Z direction and/or the width in the X direction decrease as the distance from the trench increases along the Y direction, and in some embodiments, two spaces formed from the left side and from the right side do not meet, and are separated by a part of the substrate, as shown in FIG. 1E.

Figure 11:
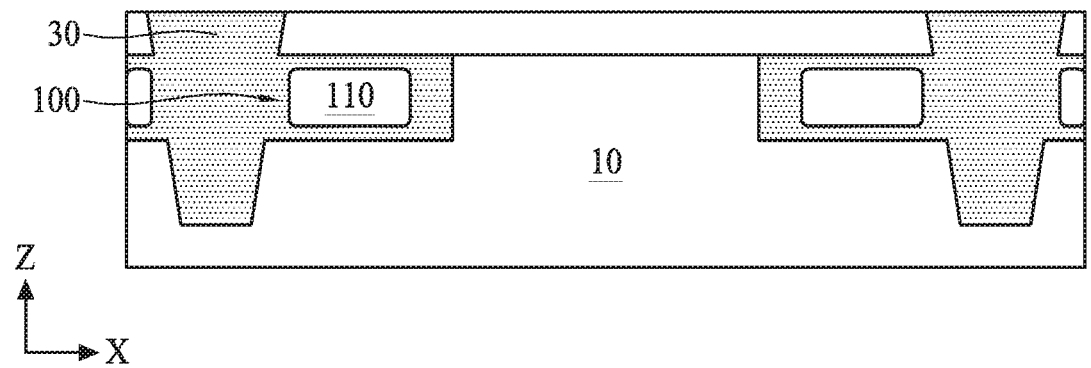
FIG. 11 shows a cross sectional view of one of the various stages of a manufacturing operation for a semiconductor device according to an embodiment of the present disclosure.

After the spaces 100 are formed, the isolation insulating layer 30 is formed in the trenches 35 and the spaces 100 as shown in FIG. 11. An insulating material for the isolation insulating layer 30 includes one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. In other embodiments, an ALD method is used.

The insulating layer 30 is first formed in a thick layer so that the entire upper surface of the epitaxial semiconductor layer 25 is covered, and the thick layer is planarized so as to expose the upper surface of the epitaxial semiconductor layer 25. In some embodiments, a chemical mechanical polishing (CMP) process is performed as the planarization process. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

As shown in FIG. 11, the insulating material for the isolation insulating layer 30 does not fully fill the spaces 100 in some embodiments, so that air spacers 110 are formed in the space 100. In some embodiments, the air spacers 110 are fully surround the insulating material for the isolation insulating layer 30. The thickness of the insulating material at the top, bottom and lateral end of the spaces 100 is not uniform in some embodiments. In other embodiments, a part of the inner wall of the space 100, which is a semiconductor layer, is exposed in the air spacers 110. In some embodiments, the lateral end of the air spacer 110 opposite to the trench 35 includes a part of the substrate 10. In other embodiments, the lateral end of the air spacer 110 opposite to the trench 35 includes a part of the impurity containing layer. In some embodiments, a part of the upper boundary of the air spacer 110 includes a part of the epitaxial semiconductor layer 25 and/or includes a part of the impurity containing layer. In other embodiments, a part of the bottom boundary of the air spacer 110 includes a part of the substrate 10 and/or includes a part of the impurity containing layer. In some embodiments, the spaces 100 are fully filled by the insulating material and no air spacer is formed.

Figure 12:
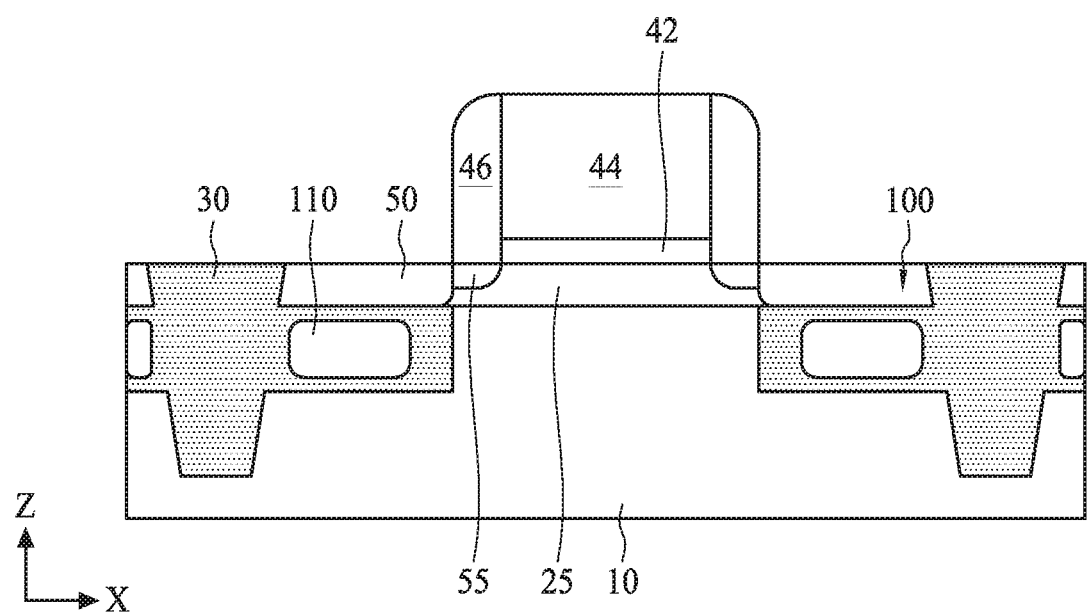
FIG. 12 shows a cross sectional view of one of the various stages of a manufacturing operation for a semiconductor device according to an embodiment of the present disclosure.

After the insulating layer 30 and the air spacers 110 are formed, a gate structure including the gate dielectric layer 42, the gate electrode layer 44 and the gate sidewall spacer 46 is formed over a channel region of the epitaxial semiconductor layer 25, as shown in FIG. 12. Further, the source/drain diffusion regions 50 and the source/drain extension regions 55 are formed as shown in FIG. 12. In some embodiments, a bottom of the source/drain diffusion region 50 is in contact with the insulating material 30 formed in the space 100. In other embodiments, the bottom of the source/drain diffusion region 50 is separated from the insulating material 30 formed in the space 100 by a part of the epitaxial semiconductor layer 25. The source/drain diffusion regions 50 are formed by one or more ion implantation operations or a thermal or plasma diffusion operation.

Figure 13:
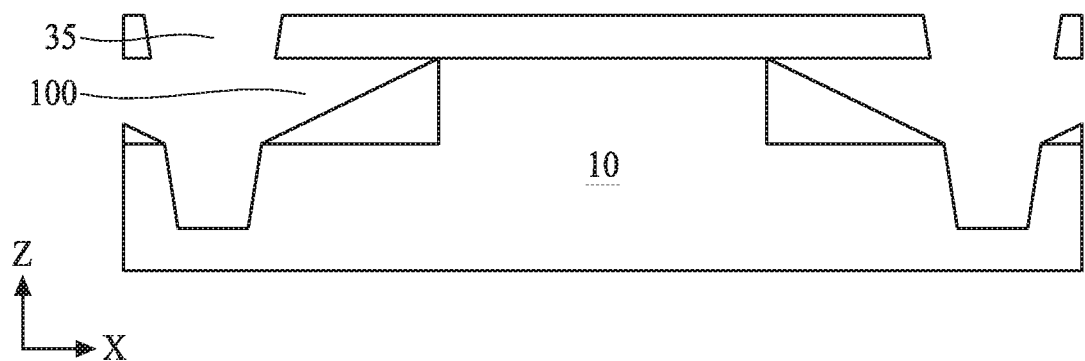
FIG. 13 shows a cross sectional view of one of the various stages of a manufacturing operation for a semiconductor device according to an embodiment of the present disclosure.
Figure 14:
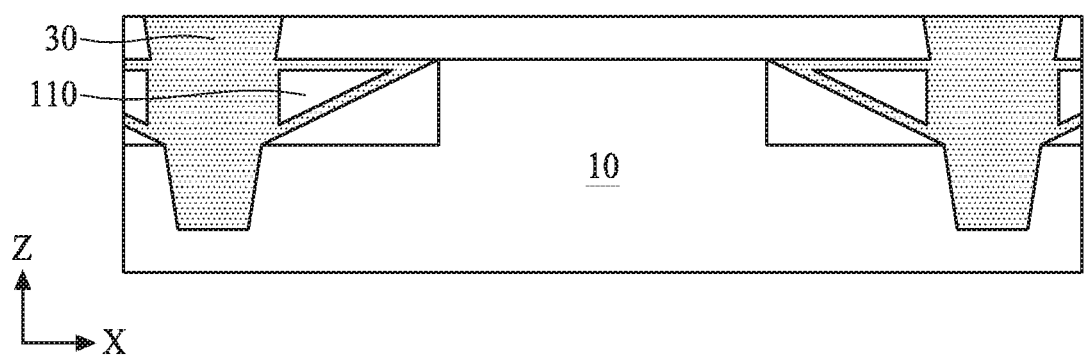
FIG. 14 shows a cross sectional view of one of the various stages of a manufacturing operation for a semiconductor device according to an embodiment of the present disclosure.
Figure 15:
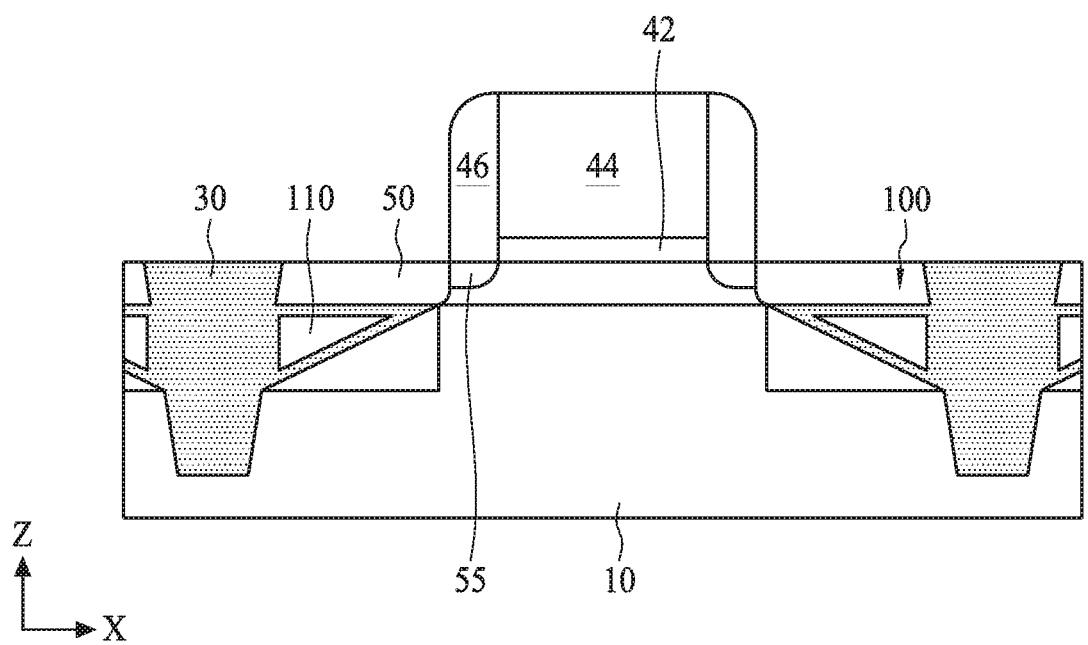
FIG. 15 shows a cross sectional view of one of the various stages of a manufacturing operation for a semiconductor device according to an embodiment of the present disclosure.

FIGS. 13-15 show cross sectional views of various stages for manufacturing a FET device according to an embodiment of the present disclosure. It is understood that additional operations can be provided before, during, and after processes shown by FIGS. 13-15, and some of the operations described below can be replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted.

After the trenches 35 are formed similar to FIG. 9, spaces 100 having a triangular or a trapezoid cross section are formed as shown in FIG. 13. In some embodiments, a wet etching operation using a TMAH aqueous solution is performed. During the wet etching, etching by-products fall on the bottom surface of the space being etched, and thus the etching rate of the bottom surface becomes smaller than the etching rate of the upper surface of the space being etched. Accordingly, the cross sectional shape has shape having a vertical depth that becomes smaller as a distance from the entrance of the space increases, such as a triangular or a trapezoid shape.

As shown in FIG. 13, an impurity containing layer (part of the sacrificial layer 20) having a higher impurity concentration than the substrate 10 and/or the epitaxial semiconductor layer 25 is disposed below or around the space 100.

Then, similar to the operations explained with respect to FIG. 11, the trenches 35 and the spaces 100 are filled with the insulating material for the isolation insulating layer 30, and the air spacers 110 are formed as shown in FIG. 14.

After the insulating layer 30 and the air spacers 110 are formed, a gate structure including the gate dielectric layer 42, the gate electrode layer 44 and the gate sidewall spacer 46 is formed over a channel region of the epitaxial semiconductor layer 25, as shown in FIG. 15. Further, the source/drain diffusion regions 50 and the source/drain extension regions 55 are formed as shown in FIG. 15. In some embodiments, a bottom of the source/drain diffusion region 50 is in contact with the insulating material formed in the space 100. In other embodiments, the bottom of the source/drain diffusion region 50 is separated from the insulating material formed in the space 100 by a part of the epitaxial semiconductor layer 25.

Figure 16:
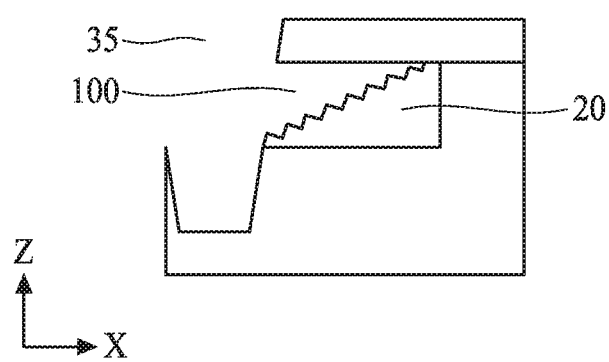
FIG. 16 shows a cross sectional view of a semiconductor device according to an embodiment of the present disclosure.

In some embodiments, at least one surface defining the space 100 has a zig-zag shape as shown in FIG. 16.

In some embodiments, less etchant reaches or contacts the end of a long distance in the space, and thus the etching rate becomes smaller as the distance from the trench increases. In such as case, as shown in FIG. 2B, the depth in the Z direction and/or the width in the X direction decrease as the distance from the trench increases along the Y direction, and in some embodiments, two spaces formed from the left side and from the right side do not meet, and are separated by a part of the substrate, as shown in FIG. 2C.

Figure 17:
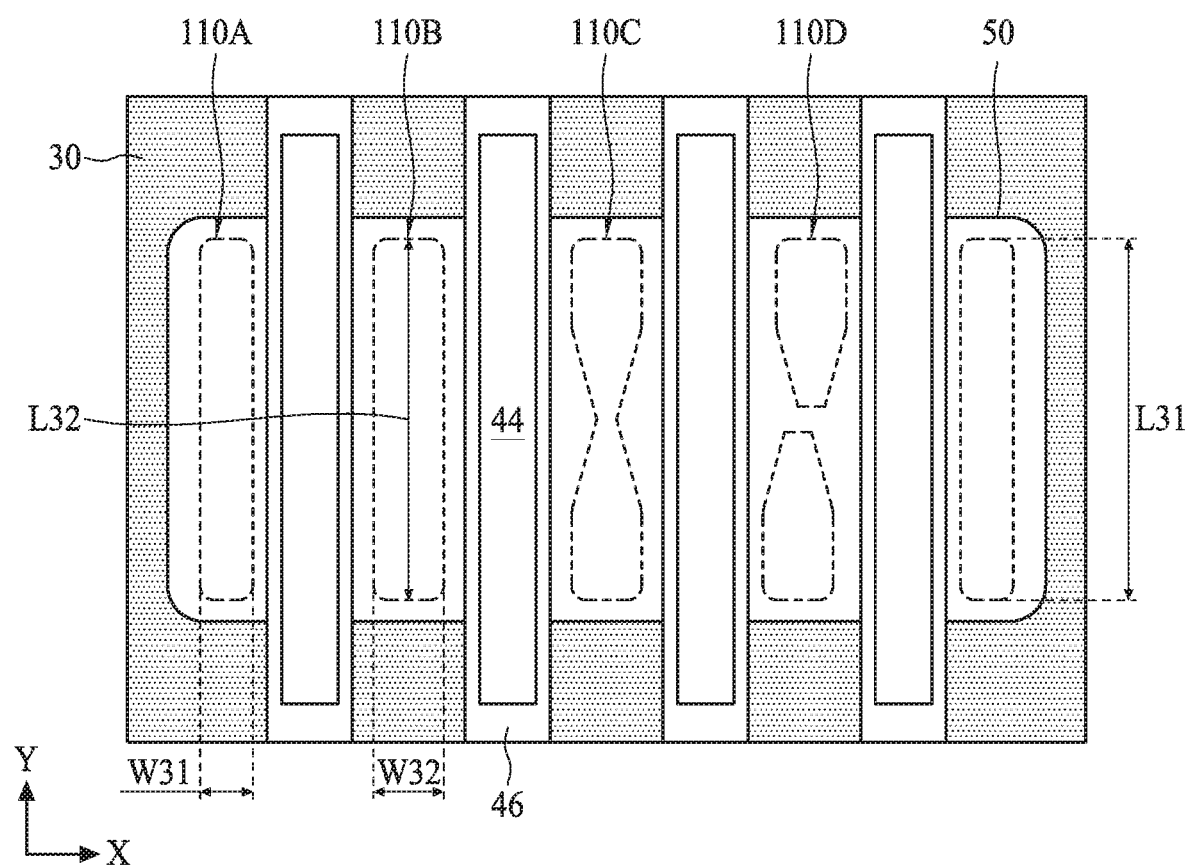
FIG. 17 shows a plan view of a semiconductor device according to an embodiment of the present disclosure.

FIG. 17 shows a plan view of a semiconductor device according to an embodiment of the present disclosure. Materials, configurations, dimensions, processes and/or operations same as or similar to those described with the foregoing embodiments may be employed in the following embodiments and the detailed explanation may be omitted.

In some embodiments, as shown in FIG. 17, a plurality of gate structures are disposed over one active region, which is channel regions and source/drain regions formed of a semiconductor and surrounded by the isolation insulating layer. In some embodiments, at least two of the plurality of gate electrodes 44 are connected, and in other embodiments, the plurality of gate electrodes 44 are not connected from each other. For illustration purposes, various configurations of air spacers are shown in one figure, but it should be understood that all the configuration do not necessarily exist in one device. In some embodiments, one or more configurations of the sir spacers exist in one device.

In some embodiments, air spacers are disposed under the source/drain diffusion regions 50. In some embodiments, the air spacer 110B disposed under the source/drain diffusion region 50 between two gate structures 44/46 has different dimensions from the air spacer 110A disposed under the source/drain diffusion region 50 along the left and/or right gate structure. In some embodiments, the width W31 of the air spacer 110A under the source/drain diffusion region 50 at the left end or the right end is greater than the width W32 of the air spacer 110B under the source/drain diffusion region 50 between two gate structures. In some embodiments, the length L31 of the air spacer 110A under the source/drain diffusion region 50 at the left end or the right end is equal to or different from the length L32 of the air spacer 110B under the source/drain diffusion region 50 between two gate structures. In some embodiments, air spacers 110C and 110D under the source/drain diffusion region has two tapered portions from the edges of the source/drain diffusion region 50 at the isolation insulating layer 20 toward the center of the source/drain diffusion region 50 (along the Y direction) in plan view. The tapered portion is caused by insufficient lateral etching of the sacrificial layer 20 under the source/drain diffusion region between two gate structures along the Y direction. In some embodiments, the air spacer 110D under the source/drain diffusion region 50 between two gate structures is discontinuous along the Y direction, while the air spacer 110C under the source/drain diffusion region 50 at the left end or the right end is continuous.

In some embodiments, the sacrificial layer is formed at a relatively deeper location in the substrate so that the surface region of the substrate 10 does not contain the dopants (e.g., As). In such a case, no semiconductor epitaxial layer 25 is formed, and the surface region is utilized as a channel region and source/drain diffusion regions.

FIGS. 18A, 18B, 18C and 18D show various views of semiconductor devices according to another embodiment of the present disclosure. Materials, configurations, dimensions, processes and/or operations same as or similar to those described with the foregoing embodiments may be employed in the following embodiments and the detailed explanation may be omitted. In this embodiment, a fin FET (Fin FET) is employed together with the embedded insulating layer.

Figure 18A:
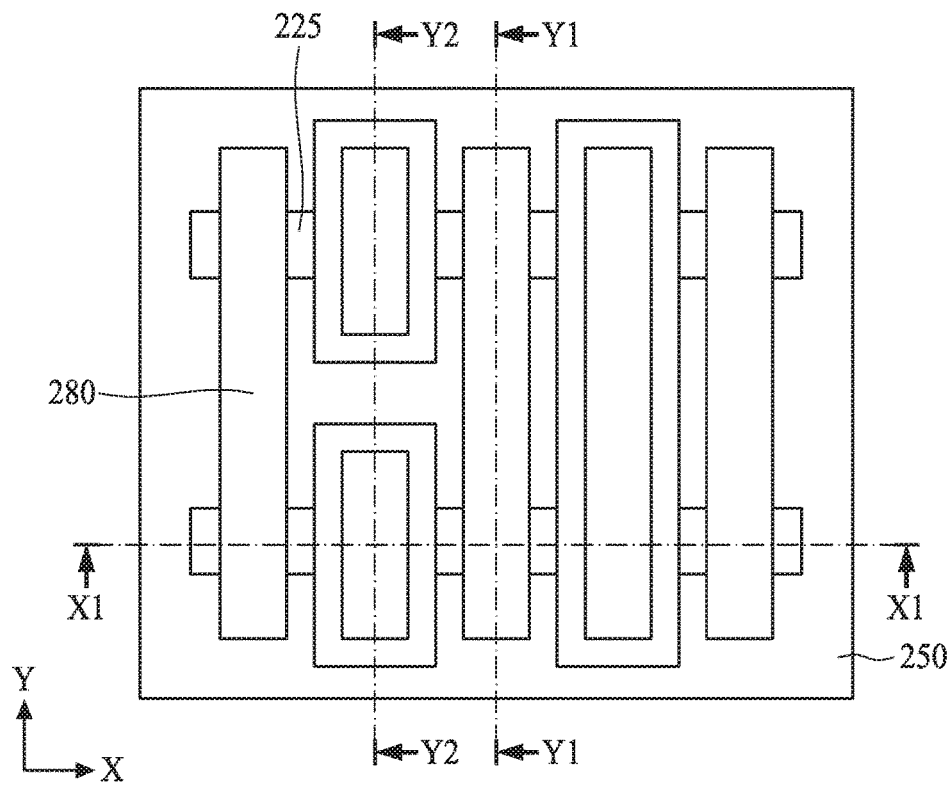
FIGS. 18A, 18B, 18C and 18D show various views of semiconductor devices according to another embodiment of the present disclosure.
Figure 18B:
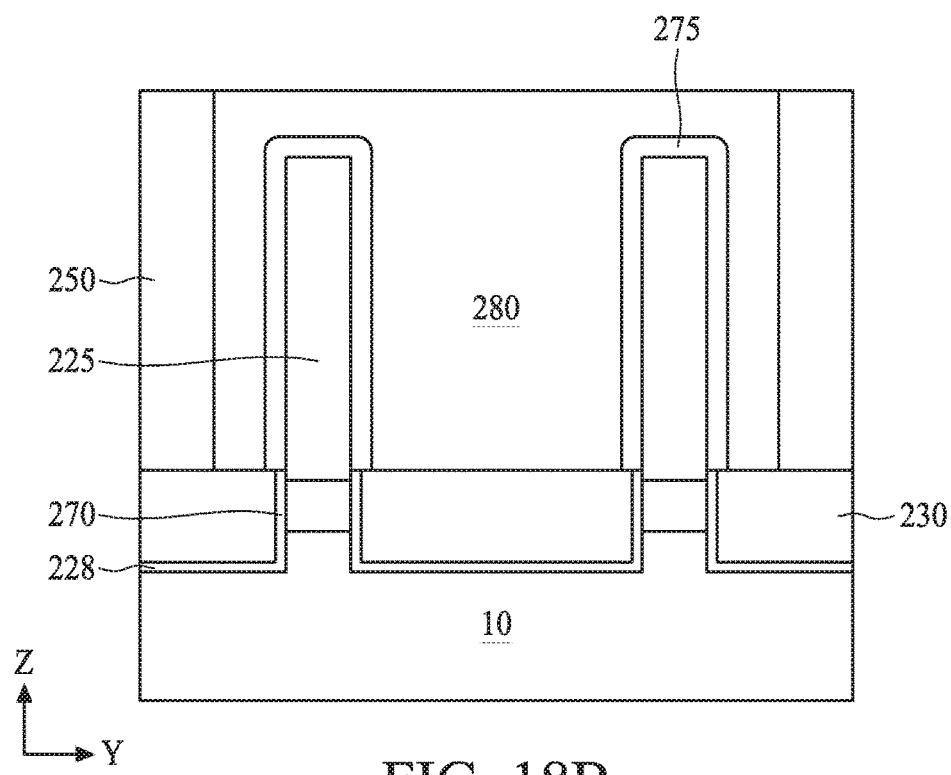
Figure 18C:
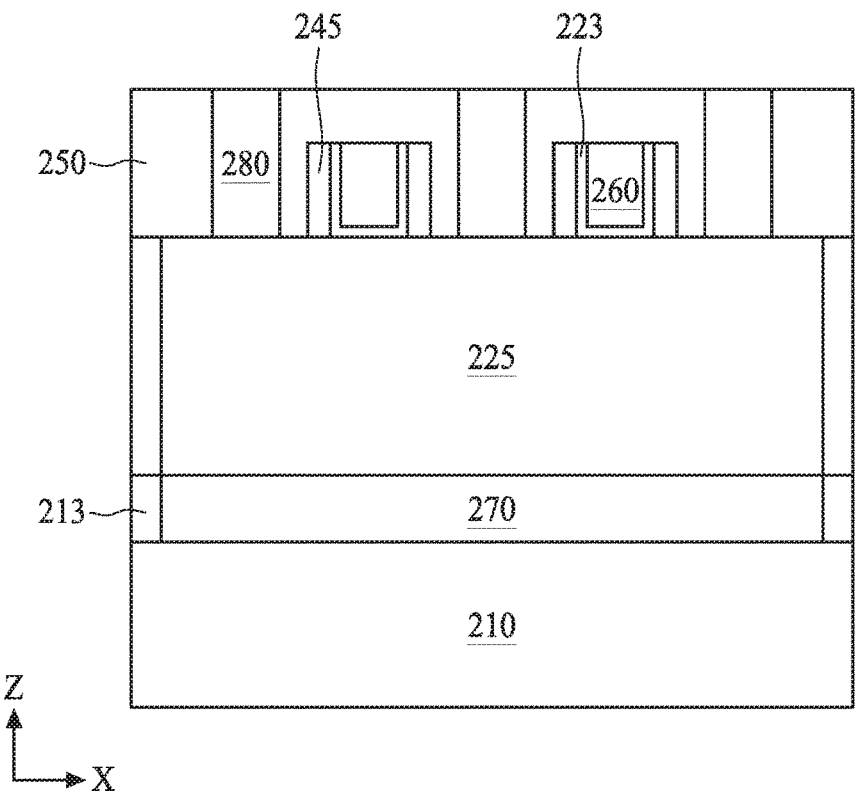
Figure 18D:
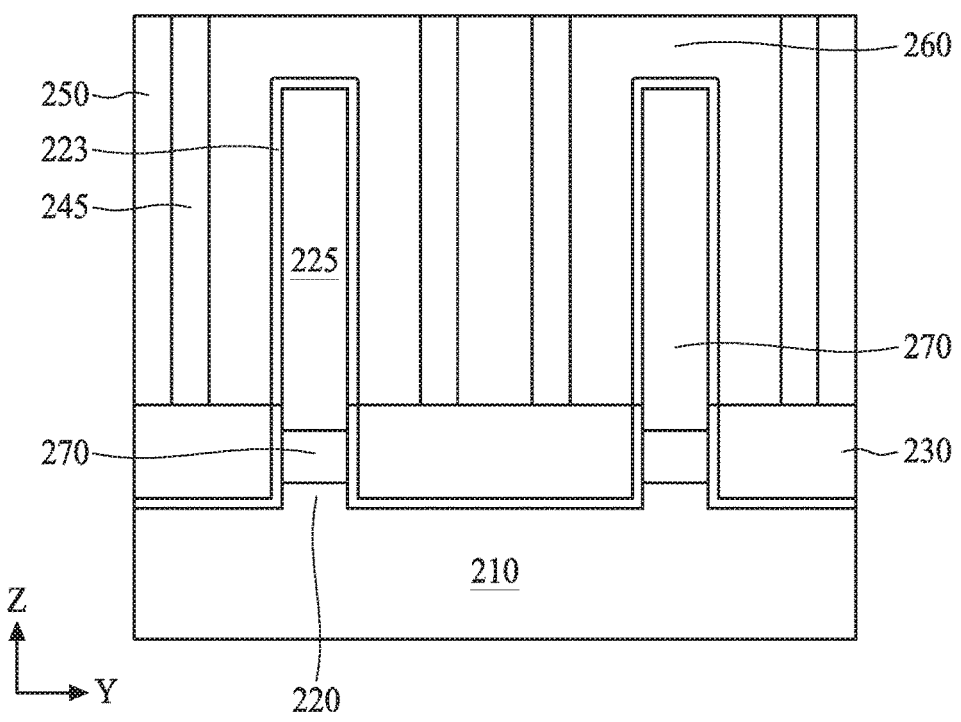

FIG. 18A is a plan view, FIG. 18B is a cross sectional view along Y1-Y1 of FIG. 18A, FIG. 18C is a cross sectional view along X1-X1 of FIG. 18A and FIG. 18D is a cross sectional view along Y2-Y2 of FIG. 18A.

As shown in FIGS. 18A and 18C, a channel region (fin structure) 225 extends in the X direction, and a metal gate structure 260 extending in the Y direction is disposed over the fin structure 225. In the source/drain region of the fin structure, an epitaxial layer 275 is formed around the fin structure 225 as shown in FIG. 18B. Further, a source/drain contact layer 280 is formed. The conductive material of the source/drain contact layer 280 includes one or more layers of Co, Ni, W, Ti, Ta, Cu, Al, TiN and TaN, or any other suitable material.

In some embodiments, a silicide layer is formed over the fin structure 225 before forming the conductive material, as shown in FIGS. 18A and 18B. The silicide layer includes one or more of WSi, CoSi, NiSi, TiSi, MoSi and TaSi. When the fin structure 225 includes Ge, an alloy of Ge and metal (e.g., TiGe, NiGe, or CoGe) is formed, and when the epitaxial layer includes Si and Ge, an alloy of Si, Ge and metal (e.g., NiSiGe or TiSiGe) is formed. When the fin structure 225 includes a Group III-V semiconductor, an alloy such as Ni—InAlAs is formed.

The gate electrode layer 260 is disposed between gate sidewall spacers 248 and is formed on a gate dielectric layer 223. The gate dielectric layer 223 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 223 includes an interfacial layer formed between the channel layers and the dielectric material. The gate dielectric layer 223 may be formed by CVD, ALD or any suitable method. In one embodiment, the gate dielectric layer 223 is formed using a highly conformal deposition process such as ALD in order to ensure the formation of a gate dielectric layer having a uniform thickness around each channel layer. The thickness of the gate dielectric layer 223 is in a range from about 1 nm to about 6 nm in one embodiment.

The gate electrode layer 260 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 260 may be formed by CVD, ALD, electro-plating, or other suitable method. The gate dielectric layer and the electrode layer are also deposited over the upper surface of an ILD layer 250. The gate dielectric layer and the gate electrode layer formed over the ILD layer 250 are then planarized by using, for example, CMP, until the top surface of the ILD layer 250 is revealed.

In certain embodiments of the present disclosure, one or more work function adjustment layers (not shown) are interposed between the gate dielectric layer 223 and the gate electrode layer 260. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

As shown in FIGS. 18B and 18D, an isolation insulating layer 230 (e.g., STI) is formed over the substrate 210. As shown in FIGS. 18B-18D, the fin structure 225 is insulated from a substrate 210 or a bottom fin structure 220 by an embedded insulating layer 270, which corresponds to the lateral part the isolation insulating layer 30 in the above embodiments. In some embodiments, the embedded insulating layer 270 includes an air spacer similar to air spacer 110. In some embodiments, one or more fin liner layers 228 are formed over the bottom fin structures 220. The fin liner layer 228 may be made of SiN or a silicon nitride-based material (e.g., SiON or SiCN). In some embodiments, a doped layer 213 (a part of the sacrificial layer 212 explained below) is disposed between adjacent fin structures. In some embodiments, a doped layer is disposed between the embedded insulating layer 270 and a bottom of the fin structure 225 and/or a top of the bottom fin structure 220. In some embodiments, the embedded insulating layer 270 and the isolation insulating layer 230 are continuously formed by the same insulating material.

Figure 19A:
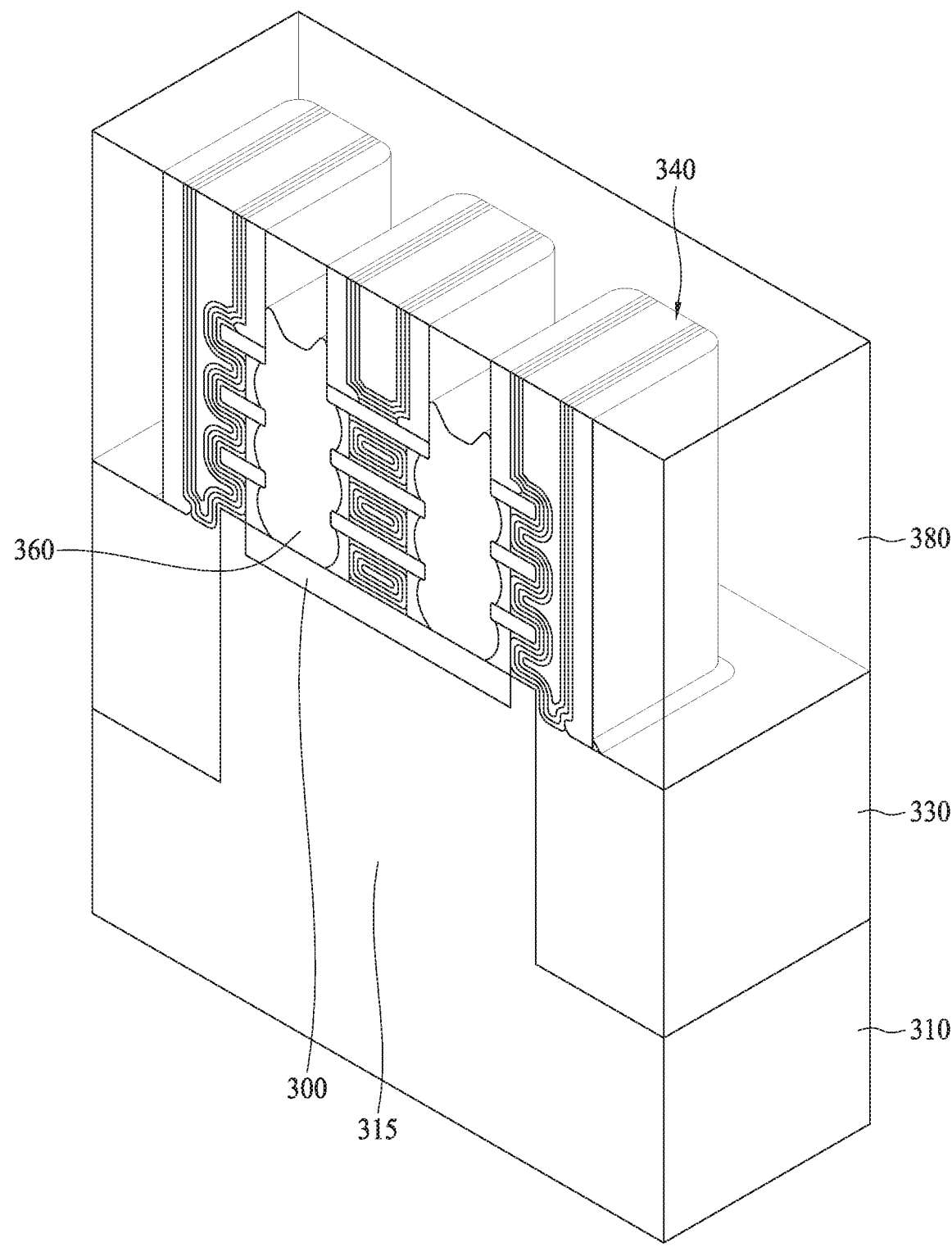
FIGS. 19A and 19B show various views of semiconductor devices according to another embodiment of the present disclosure.
Figure 19B:
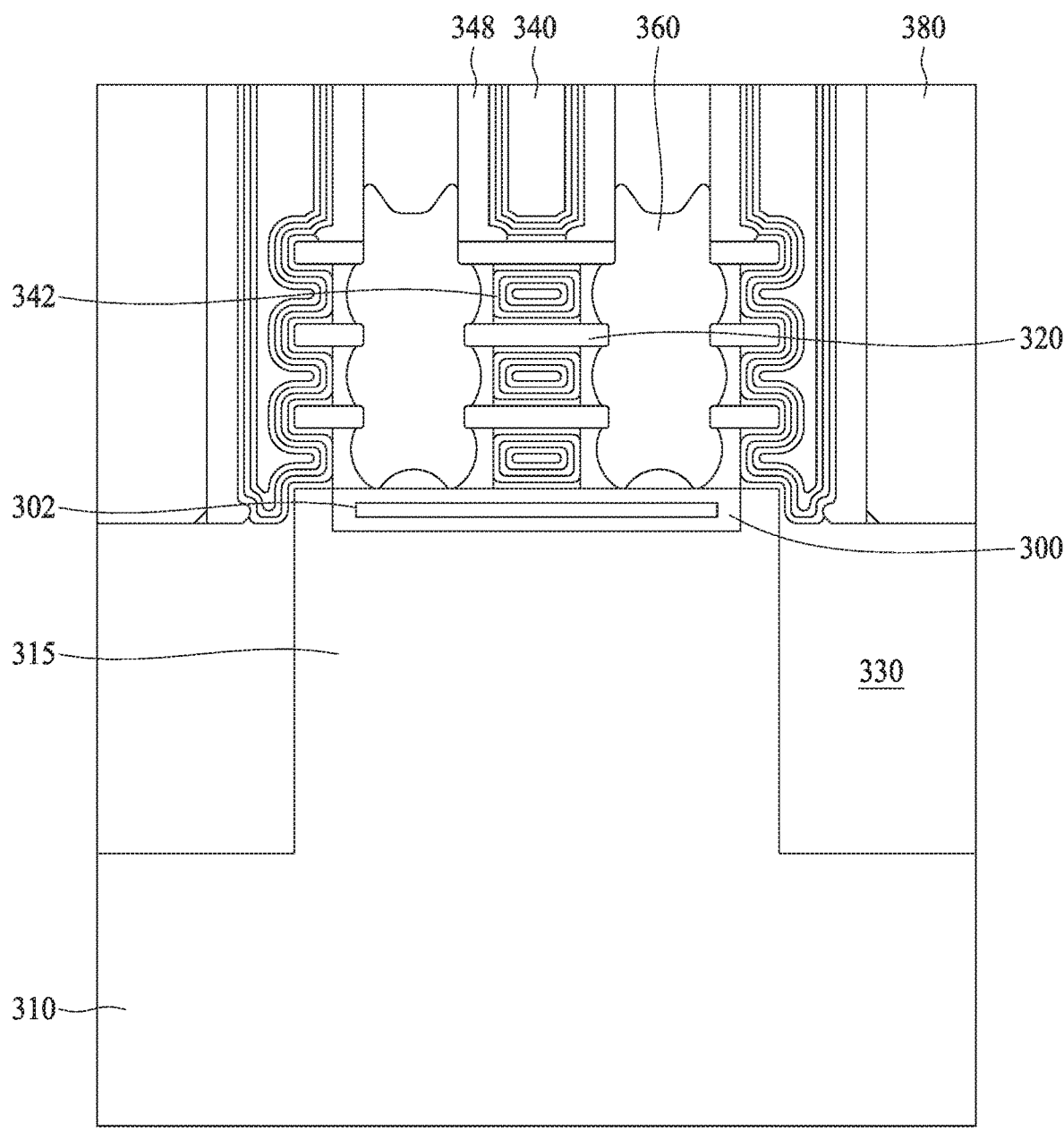

FIGS. 19A and 19B show various views of semiconductor devices according to another embodiment of the present disclosure. Materials, configurations, dimensions, processes and/or operations same as or similar to those described with the foregoing embodiments may be employed in the following embodiments and the detailed explanation may be omitted. In this embodiment, a gate-all-around FET (GAA FET) is employed together with the embedded insulating layer.

As shown in FIGS. 19A and 19B, a bottom fin structure 315 is disposed over a substrate 310 and one or more semiconductor wires or sheets 320 are disposed over the bottom fin structure 315. The channel region of each of the wires or sheets 320 is wrapped around by a gate structure, which includes a gate dielectric layer 342 and a gate electrode layer 340. In some embodiments, the gate electrode layer 340 includes one or more work function adjustment layer. As shown in FIGS. 19A and 19B, the gate structure is surrounded by a gate sidewall spacer 348 and an isolation insulating layer 330 is disposed over the substrate 310.

In some embodiments, a source/drain epitaxial layer 360 is formed on the lateral ends of the wires or sheets 320. In other embodiments, source/drain epitaxial layer 360 wraps around source/drain regions of the wires or sheets 320.

As shown in FIGS. 19A and 19B, the source/drain epitaxial layer 360 is insulated from a substrate 310 or the bottom fin structure 315 by an embedded insulating layer 300, which corresponds to the lateral part the isolation insulating layer 30 in the above embodiments. In some embodiments, the embedded insulating layer 300 includes an air spacer 302 similar to air spacer 110.

FIGS. 20-25 show views of various stages for manufacturing a semiconductor device according to an embodiment of the present disclosure. It is understood that additional operations can be provided before, during, and after processes shown by FIGS. 20-25, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted. The semiconductor device of FIGS. 20-25 corresponds to the semiconductor device of FIGS. 18A-18D.

Figure 20:
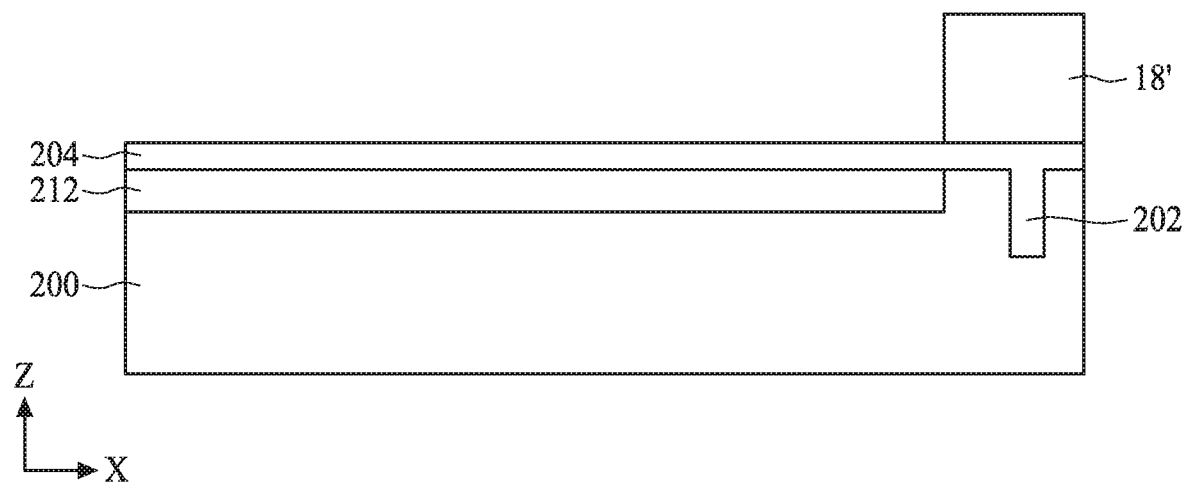
FIGS. 20, 21, 22, 23, 24A and 24B show cross sectional views of the various stages of a manufacturing operation for a semiconductor device according to another embodiment of the present disclosure.

Similar to FIG. 4, by using one or more lithography operations, a photo resist pattern as a first mask pattern 18' is formed over a cover layer 204 as shown in FIG. 20. An alignment key 202 is formed in some embodiments.

Figure 21:
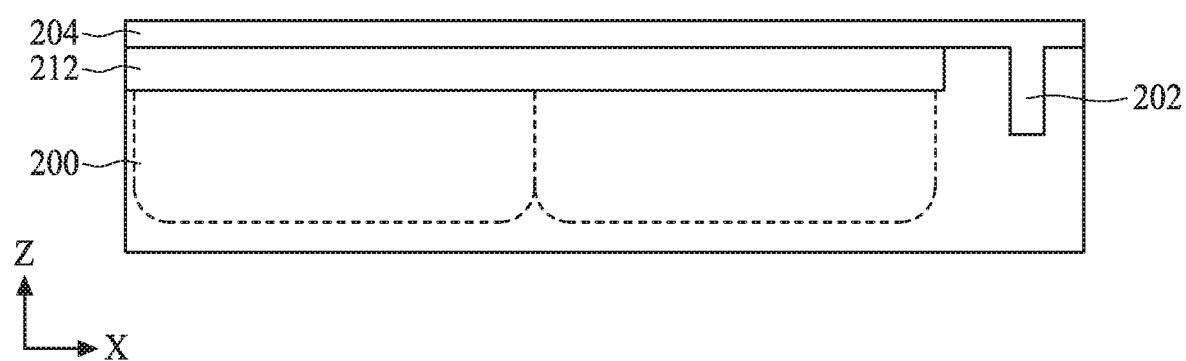

Similar to FIGS. 5 and 6, one or more ion implantation operations are performed to form sacrificial regions 212 containing dopants as shown in FIG. 21. In some embodiments, after the ion implantation operations and removal of the mask layer 18', a thermal process, for example, an anneal process, is performed similar to FIG. 6. Further, in some embodiments, well implantation operations are performed to form an n-well 200N for a PFET and a p-well 200P for an NFET are formed.

Figure 22:
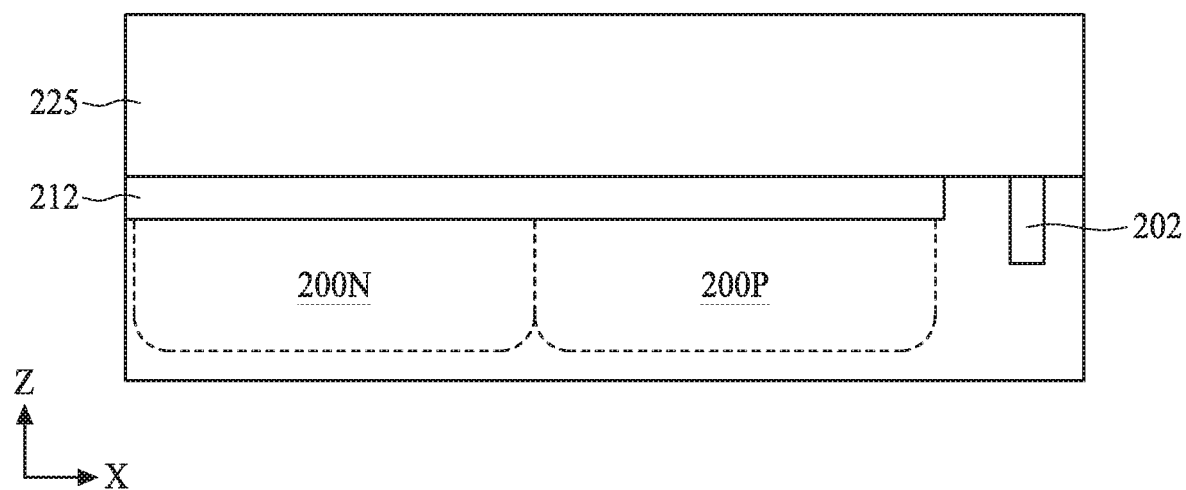

Then, similar to FIG. 7, an epitaxial semiconductor layer 225 is formed over the substrate 10 including the sacrificial layer 212, as shown in FIG. 22. Since the epitaxial semiconductor layer is subsequently formed into fin structures, a sufficiently thick epitaxial layer 225 is formed.

Figure 23:
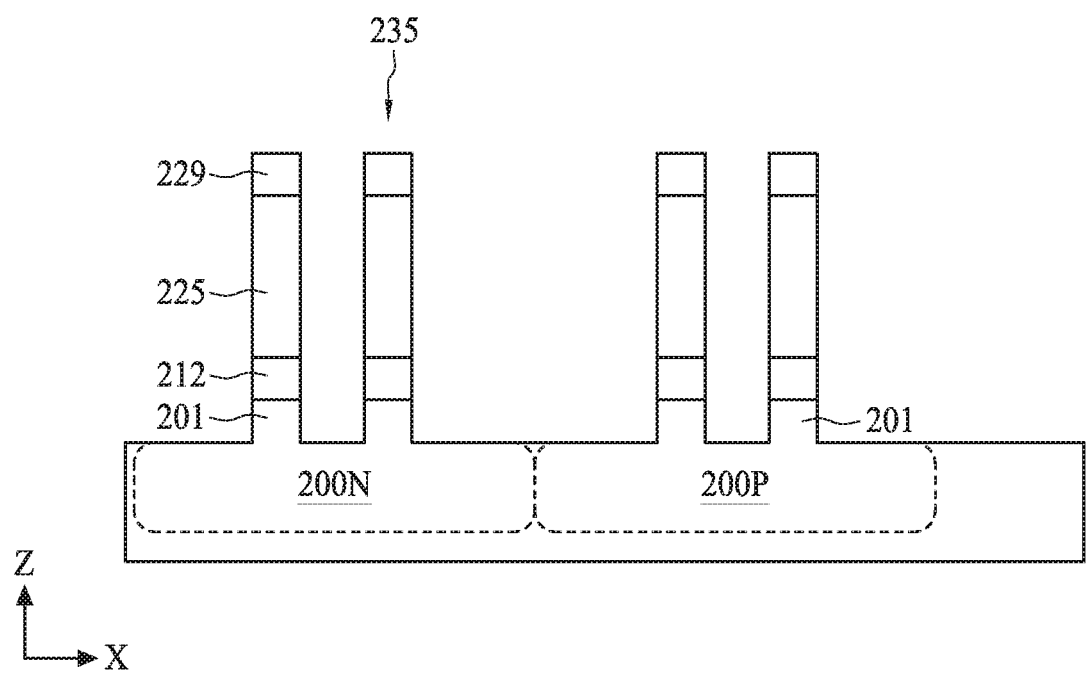

Then, as shown in FIG. 23, fin structures 235 are formed by one or more photolithography and etching operations. The fin structures 235 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins. In some embodiments, a hard mask pattern 229 is used.

As shown in FIG. 23, each of the fin structure 235 includes a part of the epitaxial layer 225, the sacrificial layer 212 and a part of the substrate as a bottom fin structure 201.

Figure 24A:
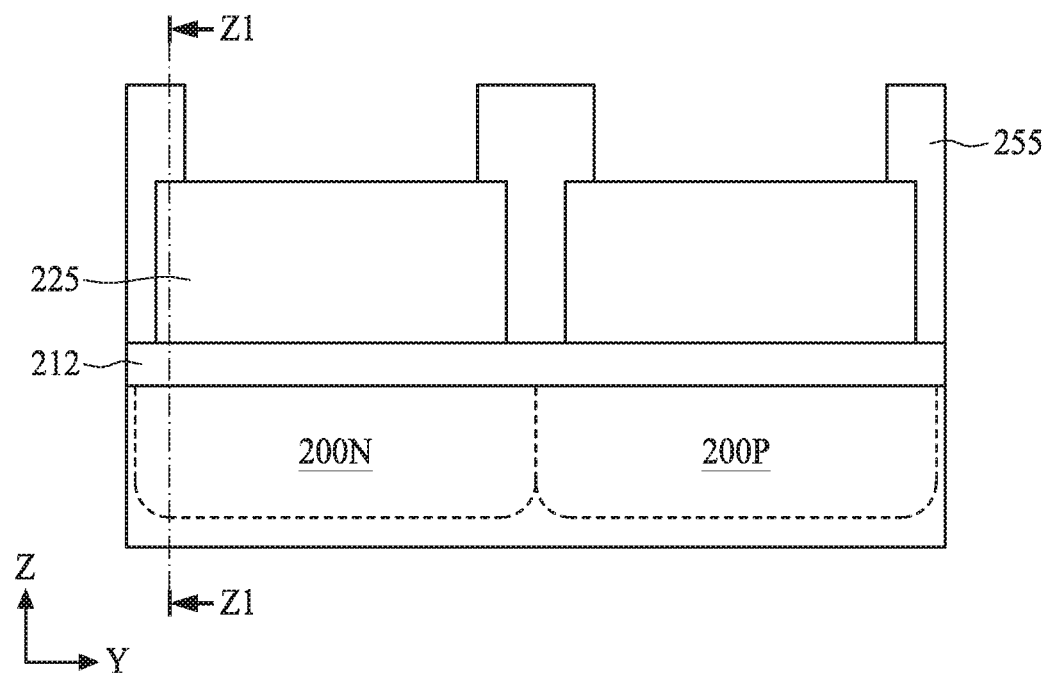
Figure 24B:
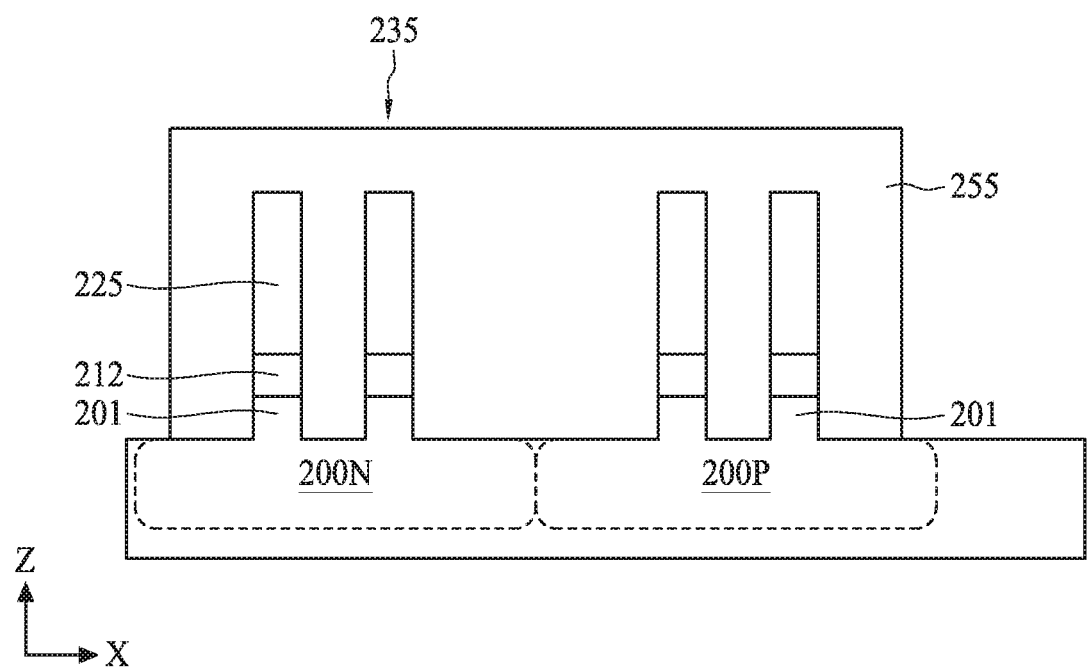

Then, in some embodiments, a support layer 255 which supports an end portion of the fin structure 235 and exposes the channel region and source/drain regions is formed as shown in FIGS. 24A and 24B. FIG. 24A is a cross sectional view along the Y direction and FIG. 24B is a cross sectional view along the X direction corresponding to line Z1-Z1 of FIG. 24A. In some embodiments, the support layer is made of silicon nitride, SiON or any other suitable dielectric material, which is formed by CVD, ALD or any other suitable film deposition method. The deposited dielectric material is patterned by using one or more lithography operation. In some embodiments, the support layer 255 covers about 1-10 nm of the edge portion of the fin structure 235. In some embodiments, one or more support layers 255 are formed over one or more middle portions of the fin structure 235.

During or after the fin structure 235 is formed, the hard mask pattern 229 is removed and then the support layer 255 is formed, as shown in FIGS. 24A and 24B. In other embodiments, after the support layer 255 is formed, the hard mask pattern 229 is removed. In such a case, a part of the hard mask pattern 229 remains under the support layer.

Figure 25A:
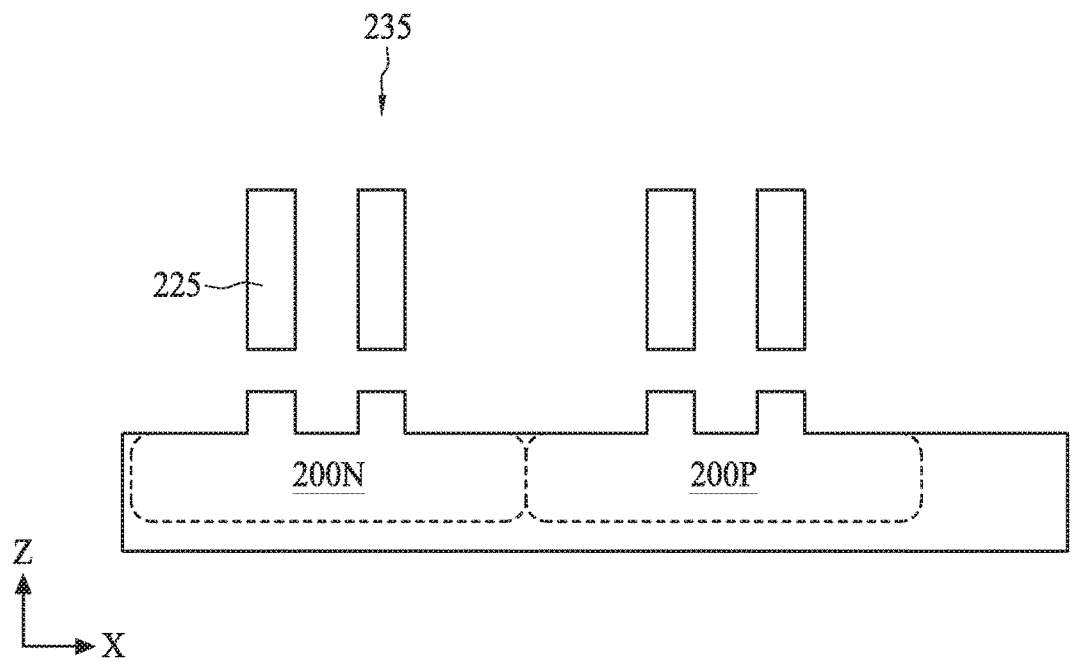
FIGS. 25A, 25B, 25C, 25D and 25E show cross sectional views of the various stages of a manufacturing operation for a semiconductor device according to another embodiment of the present disclosure.
Figure 25B:
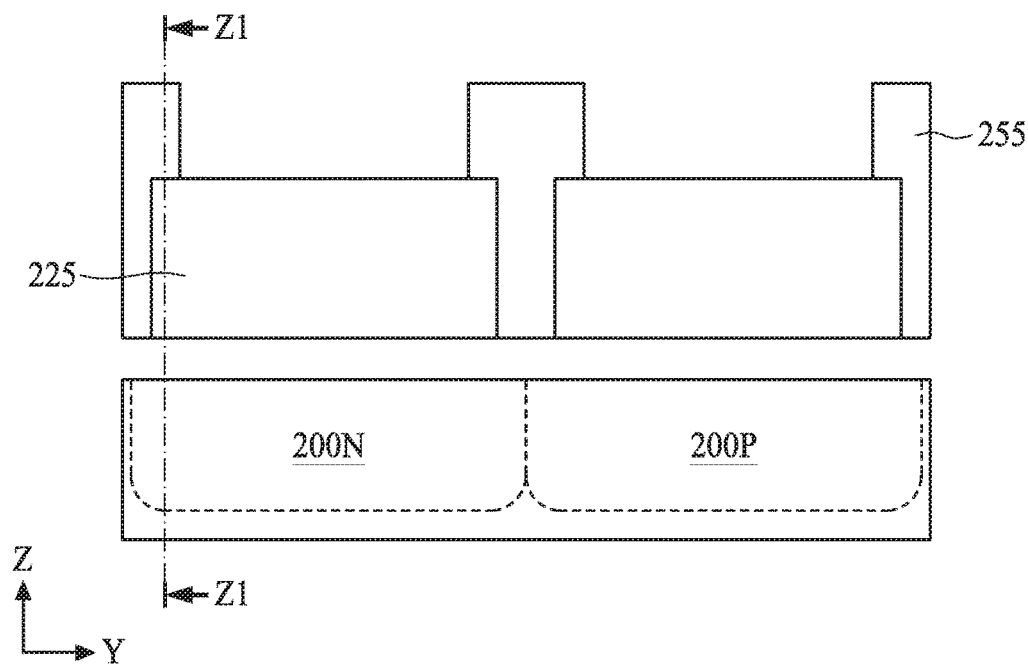
Figure 25C:
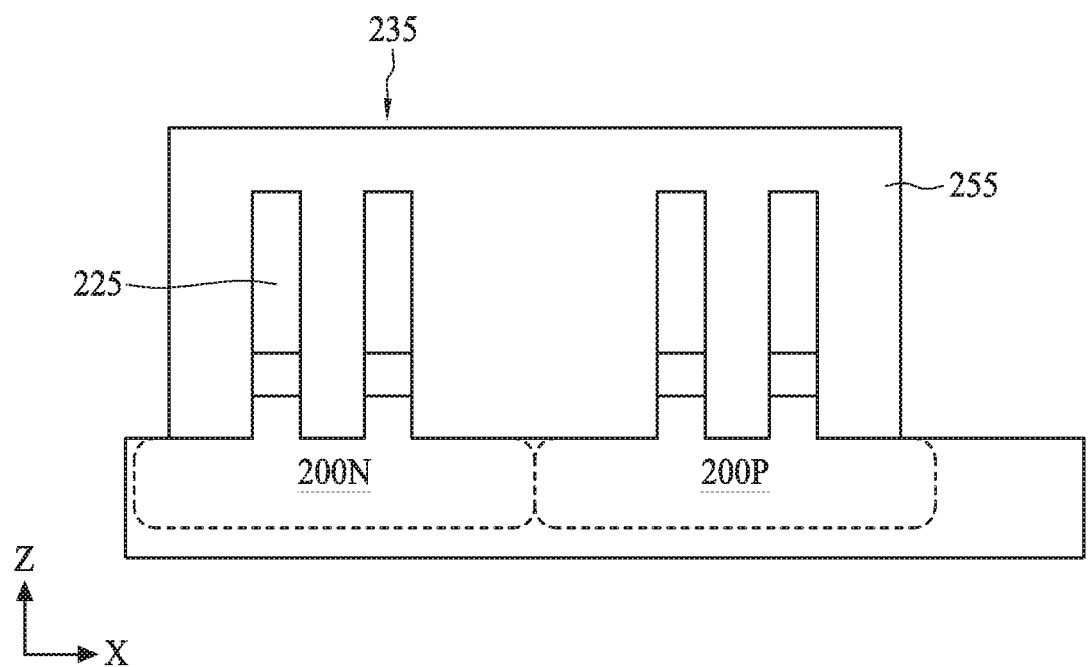
Figure 25D:
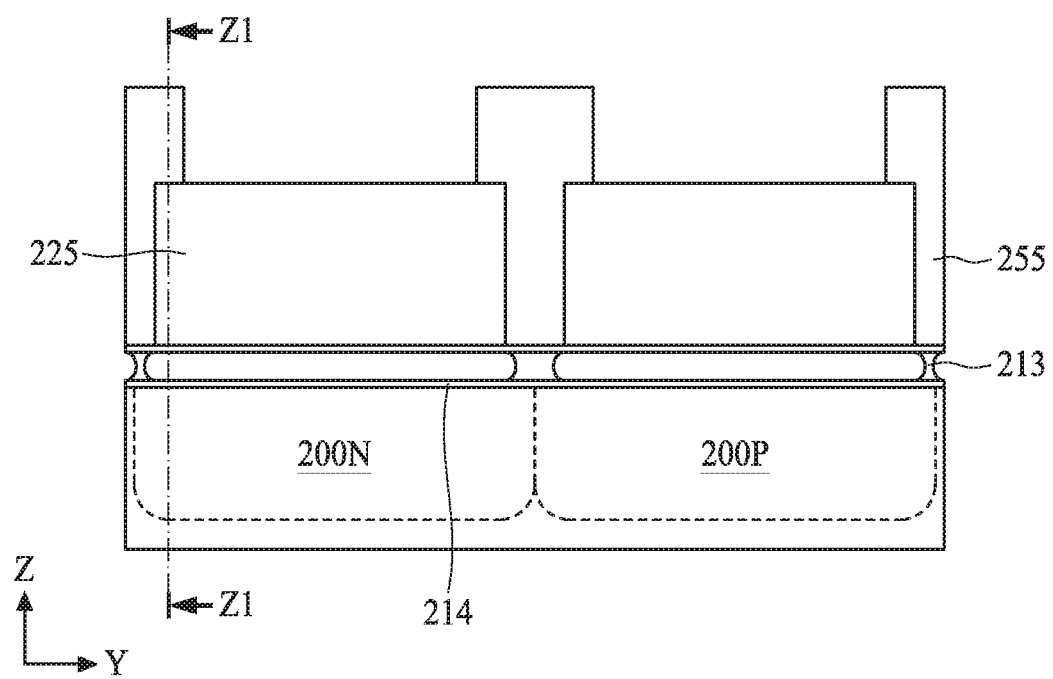
Figure 25E:
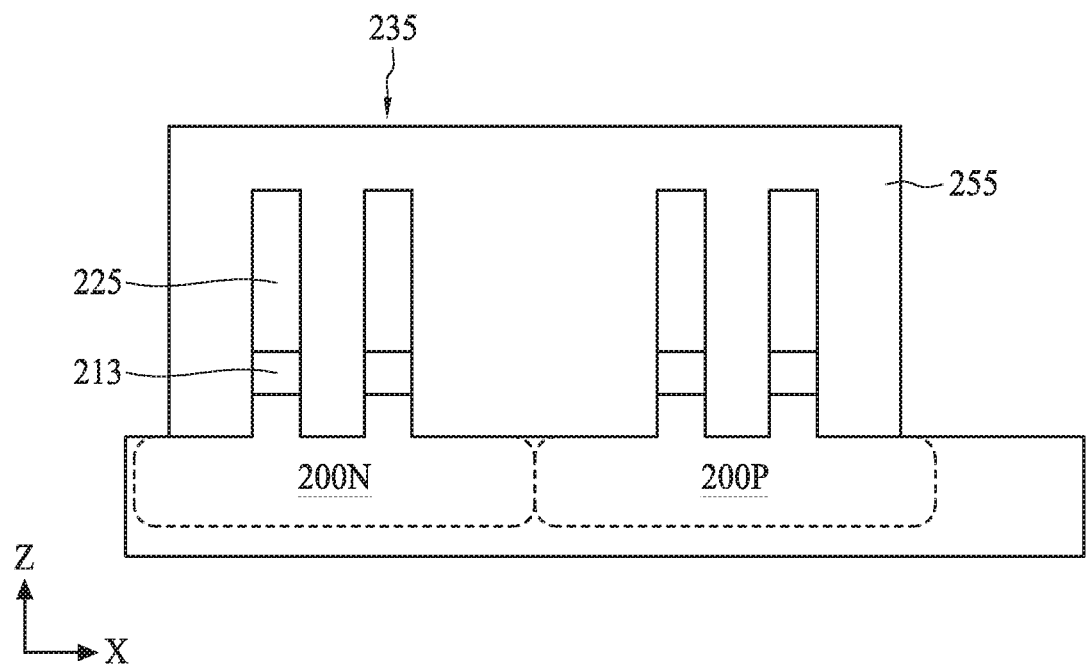

After the support layer 255 is formed, the sacrificial layer 212 is removed, as shown in FIGS. 25A-25C. FIG. 25A is a cross sectional view along the X direction and FIG. 25B is a cross sectional view along the Y direction. FIG. 25C is a cross sectional view along the X direction corresponding to line Z1-Z1 of FIG. 25B. In some embodiments, the sacrificial layer 212 is fully removed. In other embodiments, a part of the sacrificial layer 212 remains as a residue 213 under the support layer 225 as shown in FIGS. 25D and 25E. In some embodiments, a residue 214 of the sacrificial layer 212 remains a bottom of the patterned epitaxial semiconductor layer 225 and/or a top of the bottom fin structure 201, as shown in FIGS. 25D and 25E.

Figure 26A:
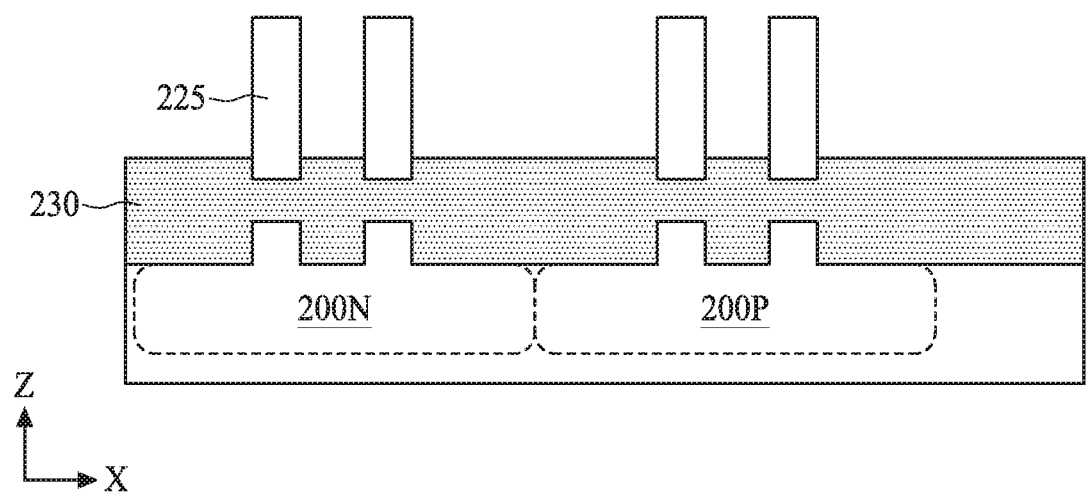
FIGS. 26A, 26B, 26C, 26D and 26E show cross sectional views of the various stages of a manufacturing operation for a semiconductor device according to another embodiment of the present disclosure.
Figure 26B:
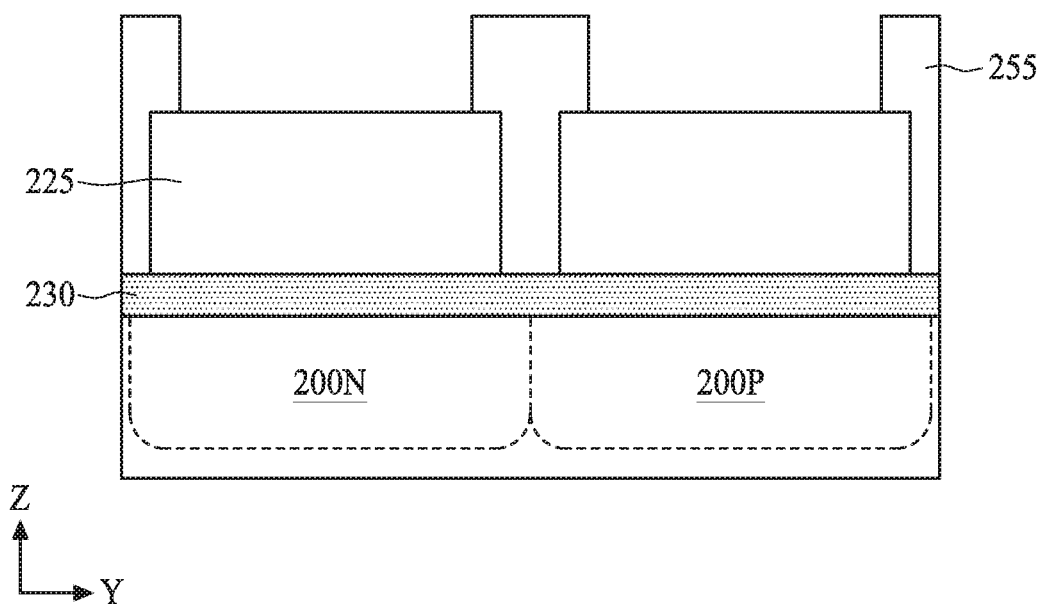
Figure 26C:
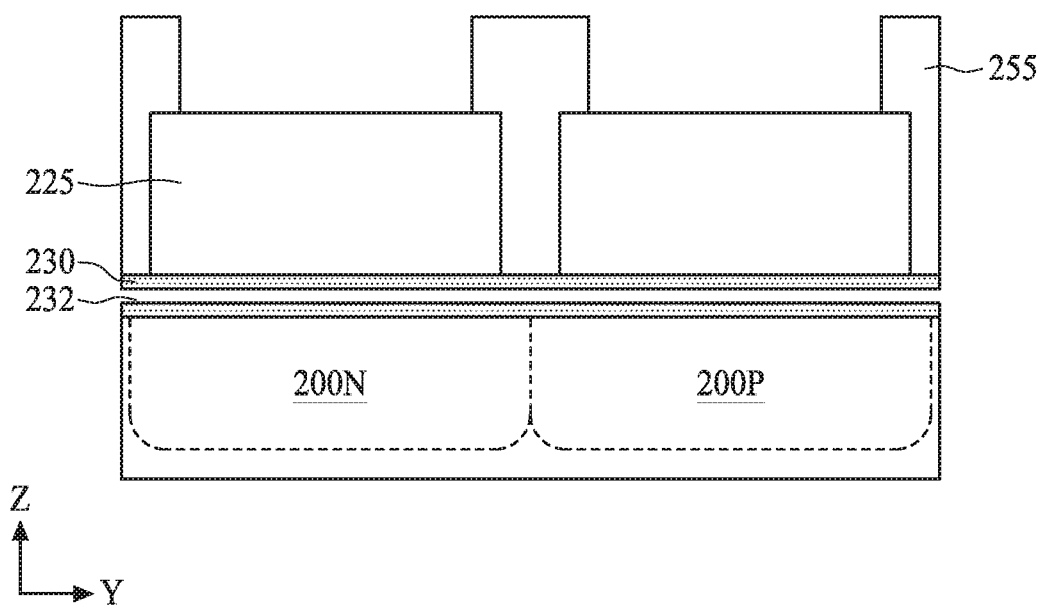
Figure 26D:
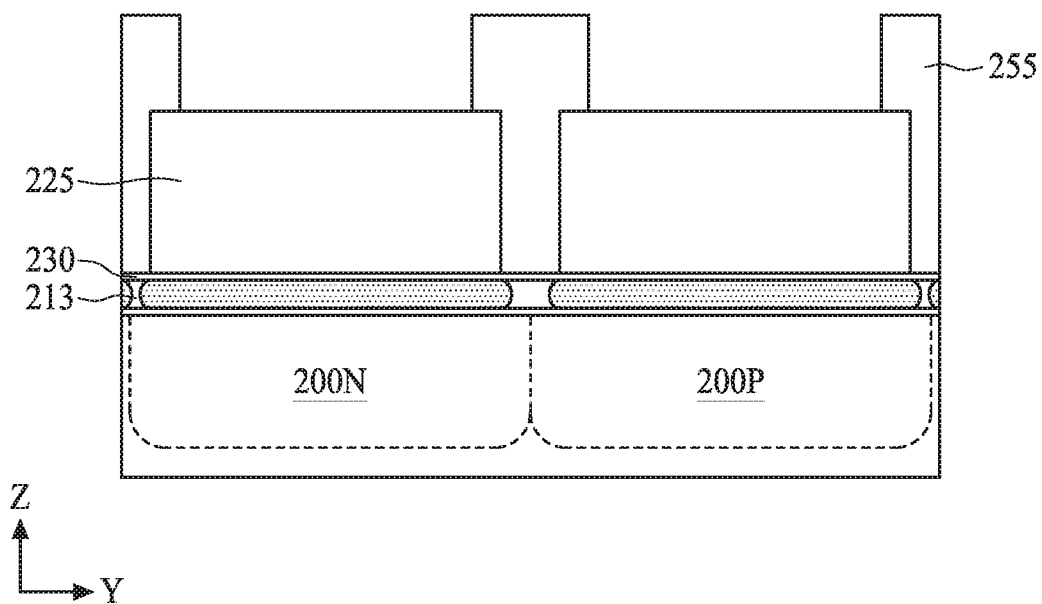
Figure 26E:
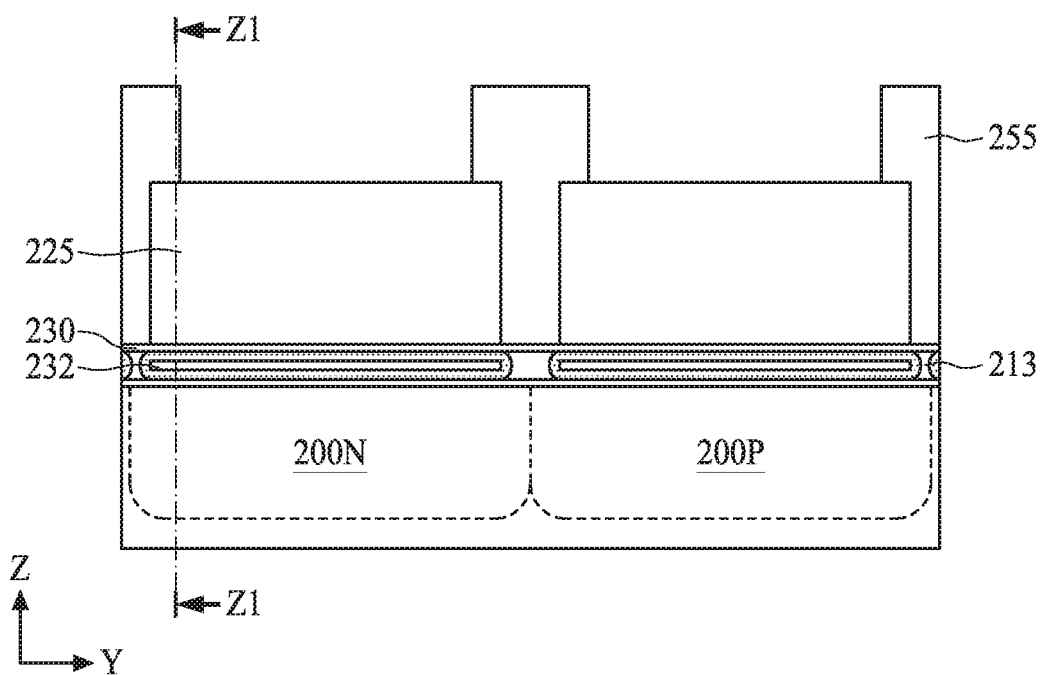

Next, an isolation insulating layer 230 is formed as shown in FIG. 26A-26C. The isolation insulating layer 230 including one or more layers of insulating material formed over the substrate 200. The insulating material for the first insulating material layer 29 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer 230 is made of silicon oxide. An anneal operation may be performed after the formation of the first insulating material layer 230. In some embodiments, as shown in FIG. 26C, an air spacer 232 similar to air spacer 110 is formed in the first insulating material layer 230 under the fin structures. In some embodiments, a part of the sacrificial layer 212 remains as a residue 213 under the support layer 225, as shown in FIGS. 26d and 26E. In some embodiments, a residue 214 of the sacrificial layer 212 remains between the first insulating material layer 230 and a bottom of the patterned epitaxial semiconductor layer 225 and/or a top of the bottom fin structure 201 as shown in FIGS. 26D and 26E.

After the isolation insulating layer 230 is formed, a dummy gate structure is formed. The dummy gate structure includes a dummy gate dielectric layer and a dummy gate electrode layer. The dummy gate dielectric layer includes one or more layers of insulating material, such as a silicon oxide-based material. In one embodiment, silicon oxide formed by CVD is used. The thickness of the dummy gate dielectric layer is in a range from about 1 nm to about 5 nm in some embodiments.

After the dummy gate structures are formed, a blanket layer of an insulating material for sidewall spacers is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as SiN, SiON, SiOCN or SiCN and combinations thereof. In some embodiments, the blanket layer (sidewall spacers 245) is made of SiN. The sidewall spacers 245 are formed on opposite sidewalls of the dummy gate structures by anisotropic etching.

After the sidewall spacers 245 are formed, an interlayer dielectric (ILD) layer 250 is formed. The materials for the ILD layer 250 include compounds comprising Si, O, C and/or H, such as silicon oxide, SiCOH and SiOC. Organic materials, such as polymers, may be used for the ILD layer 250. After the ILD layer 250 is formed, a planarization operation, such as CMP, is performed, so that the top portions of the dummy gate electrode layers of the dummy gate structures are exposed.

In some embodiments, a source/drain epitaxial layer 275 is then formed on the source/drain region of the fin structure 225. In some embodiments, the source/drain epitaxial layer 275 includes one or more layers of SiP, SiC, SiCP, SiGe, Ge or other suitable material.

Next, the dummy gate structures are replaced with a metal gate structure and a source/drain contact layer 280 is formed as shown in FIGS. 18A-18D.

FIGS. 27-30 show views of various stages for manufacturing a semiconductor device according to an embodiment of the present disclosure. It is understood that additional operations can be provided before, during, and after processes shown by FIGS. 27-30, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted. The semiconductor device of FIGS. 27-30 corresponds to the semiconductor device of FIGS. 19A-19B.

Figure 27:
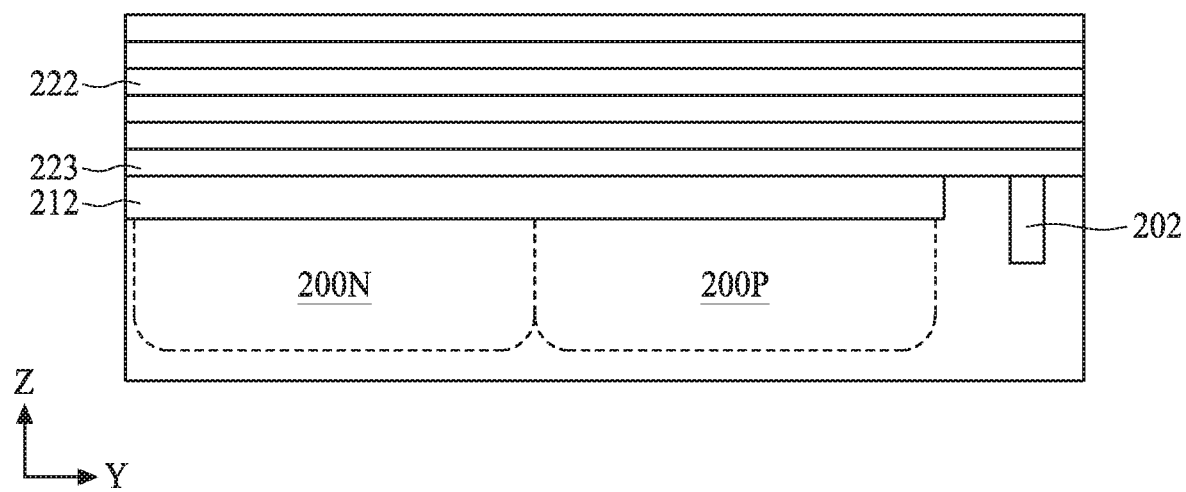
FIGS. 27, 28, 29 and 30 show cross sectional views of the various stages of a manufacturing operation for a semiconductor device according to another embodiment of the present disclosure.

After the sacrificial layer 212 is formed and the cover layer 15 is removed, epitaxial layers including multiple layers of first semiconductor layers 223 and second semiconductor layers 222 alternately stacked are formed on the substrate 200. In one embodiment, the first semiconductor layers 223 are made of SiGe and the second semiconductor layers 222 are made of Si. The first and second semiconductor layers are alternately epitaxially formed over the substrate 200 as shown in FIG. 27. In some embodiments, a part of the sacrificial layer 212 remains in the fin structures similar to FIGS. 13-16.

Figure 28:
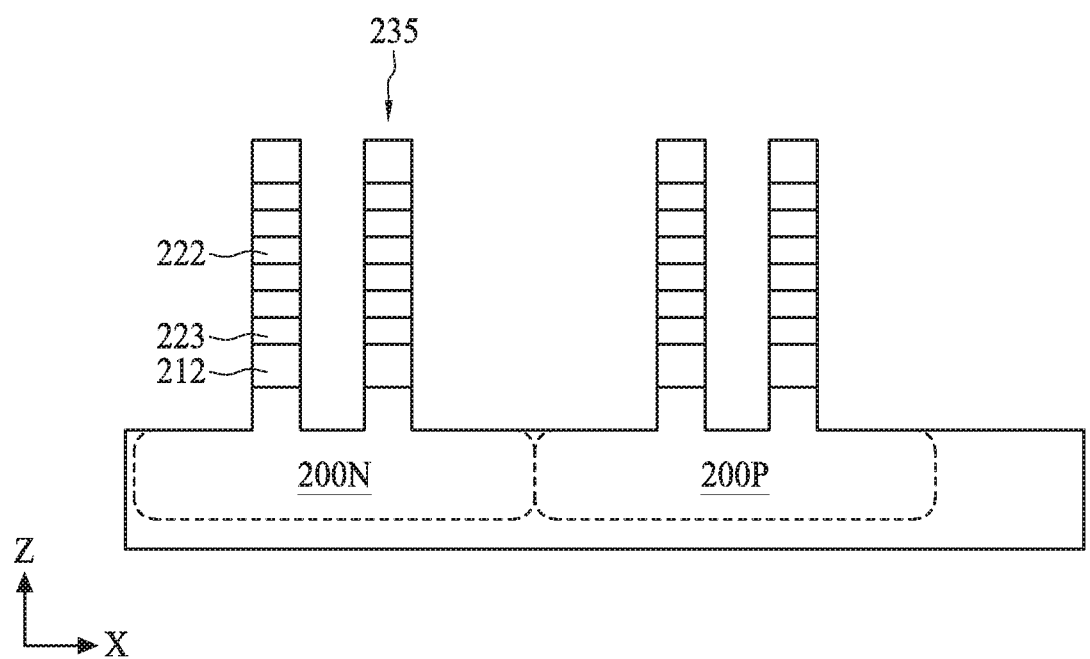
Figure 29:
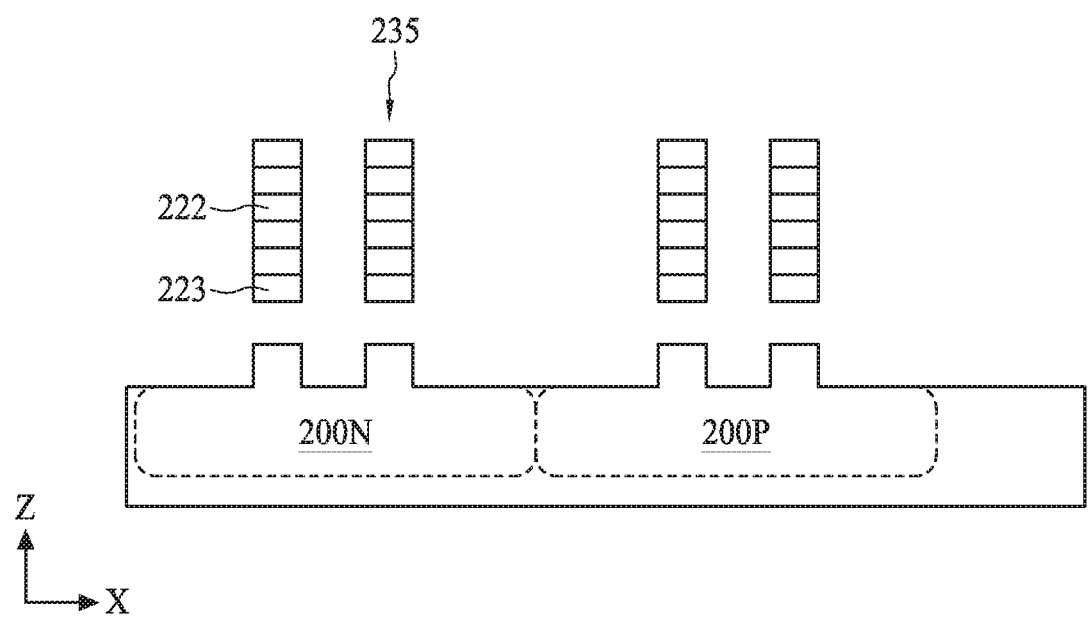
Figure 30:
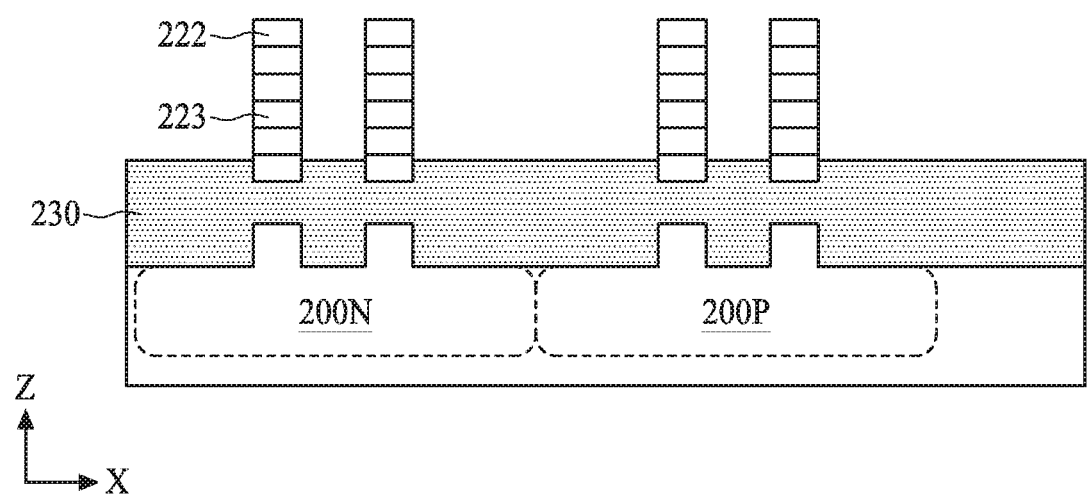

Then, similar to FIG. 23, fin structures 235 are formed by patterning operations, as shown in FIG. 28. During or after the fin structure 235 is formed, the sacrificial layer 225 is removed as shown in FIG. 29. Next, an isolation insulating layer 230 is formed as shown in FIG. 30, similar to FIG. 25.

Subsequently, the dummy gate structure is formed, the gate sidewall spacers 348 are formed, the source/drain epitaxial layer 360 is formed, and an ILD layer 380 is formed. In some embodiments, the source/drain region is etched and then the source/drain epitaxial layer 360 is formed.

Then, the dummy gate structure is removed to form a gate space and the first semiconductor layers 223 are removed in the gate space, leaving the second semiconductor layer 222 as the semiconductor wires or sheets 320. Then, the gate dielectric layer 342 and the gate electrode 340 are formed, as shown in FIGS. 19A and 19B.

Figure 31A:
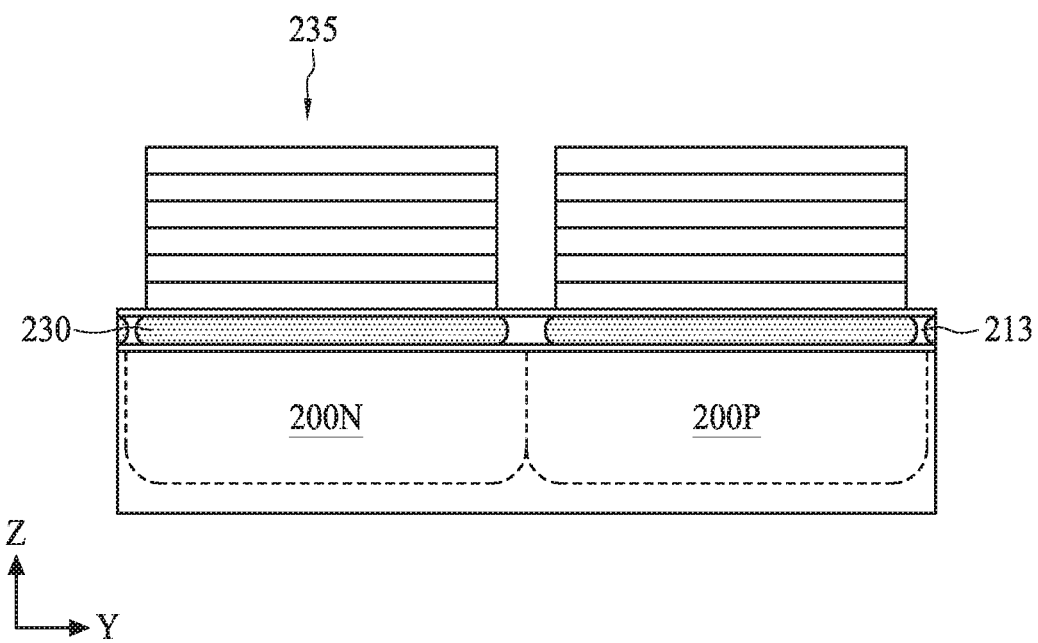
FIGS. 31A and 32B show cross sectional views of the various stages of a manufacturing operation for a semiconductor device according to another embodiment of the present disclosure.
Figure 31B:
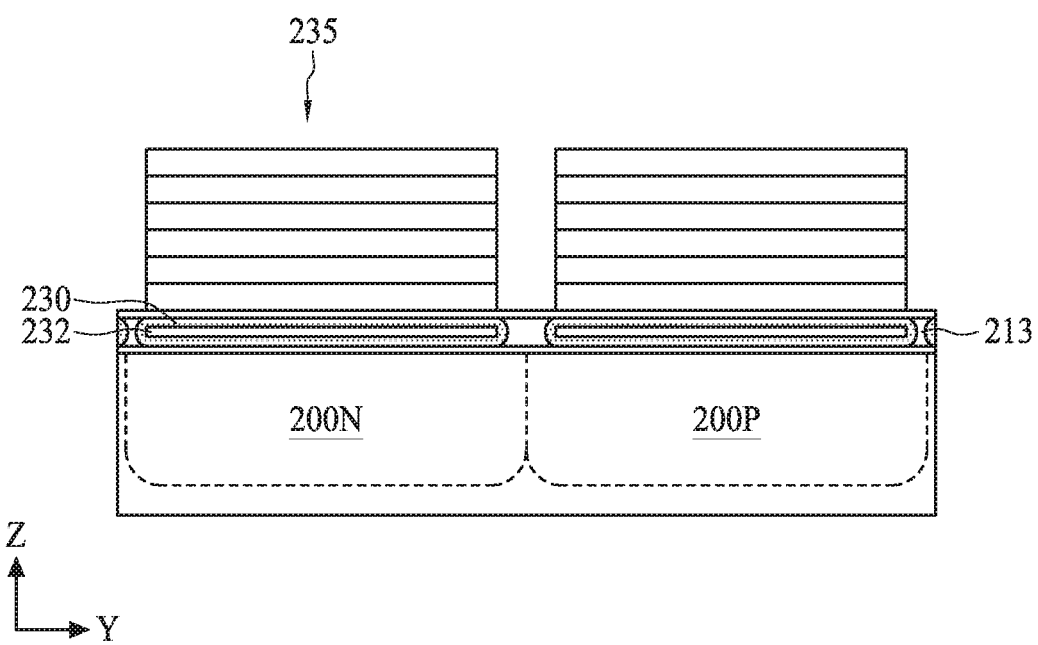

In some embodiments, a part of the sacrificial layer 212 remains as a residue 213 under the support layer 225, as shown in FIGS. 31A and 31B. In some embodiments, a residue 214 of the sacrificial layer 212 remains between the first insulating material layer 230 and a bottom of the patterned epitaxial semiconductor layer 225 and/or a top of the bottom fin structure 201 as shown in FIGS. 31A and 31B. In some embodiments, the embedded insulating layer 270 includes an air spacer 232 similar to air spacer 110 as show in FIG. 31B.

FIGS. 32A, 32B, 32C, 32D and 32E show cross sectional views of the various stages of a manufacturing operation for a semiconductor device according to an embodiment of the present disclosure. In some embodiments, similar to the sacrificial layer 225 as explained above, before the sacrificial layer 225 is removed by etching, a support layer 255 is formed on both ends of the fin structure 235 exposing the channel region and source/drain regions. In some embodiments, the support layer 255 is made of silicon nitride.

Figure 32A:
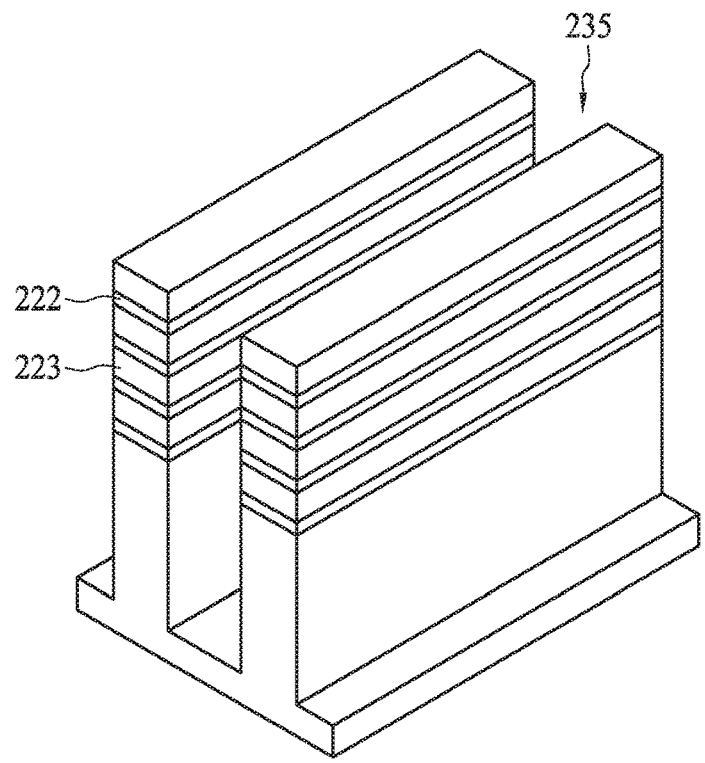
Figure 32B:
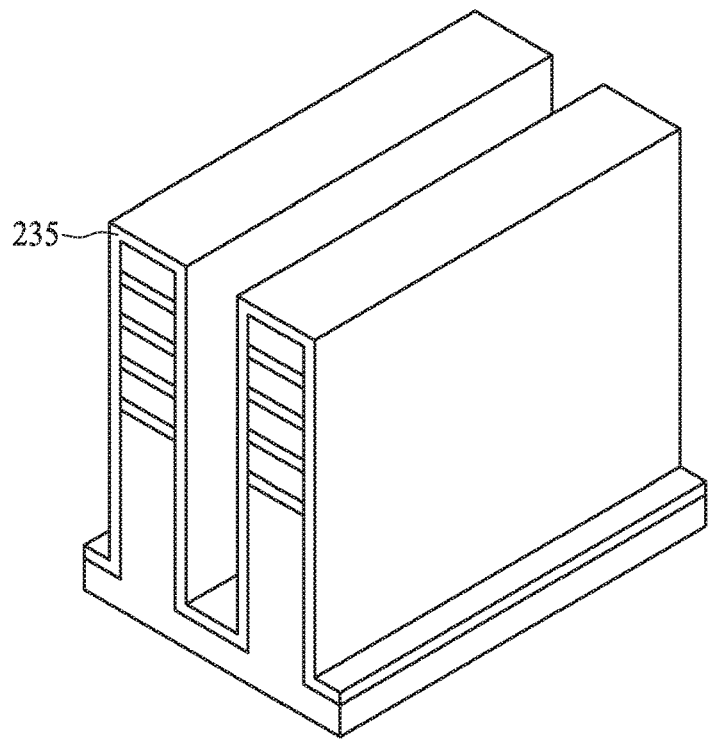
Figure 32C:
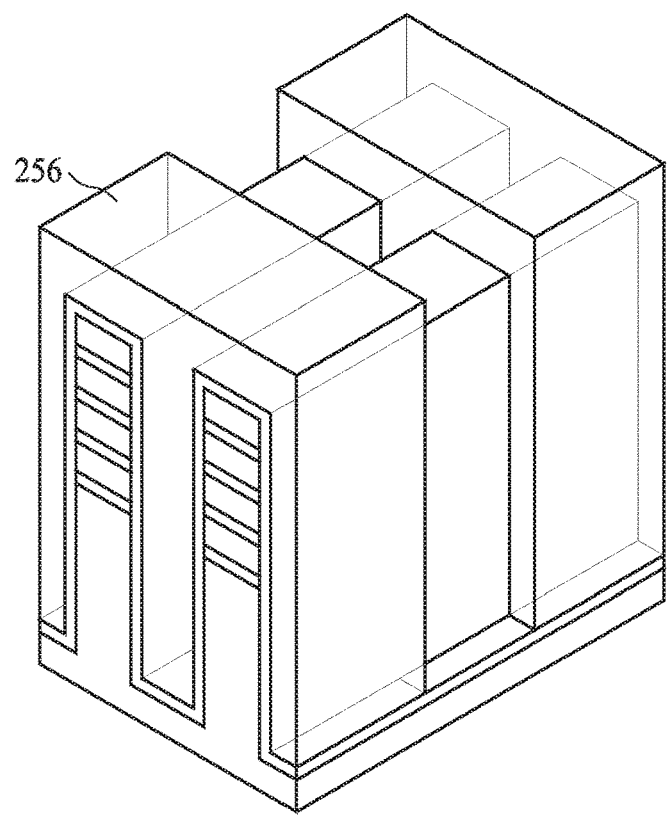
Figure 32D:
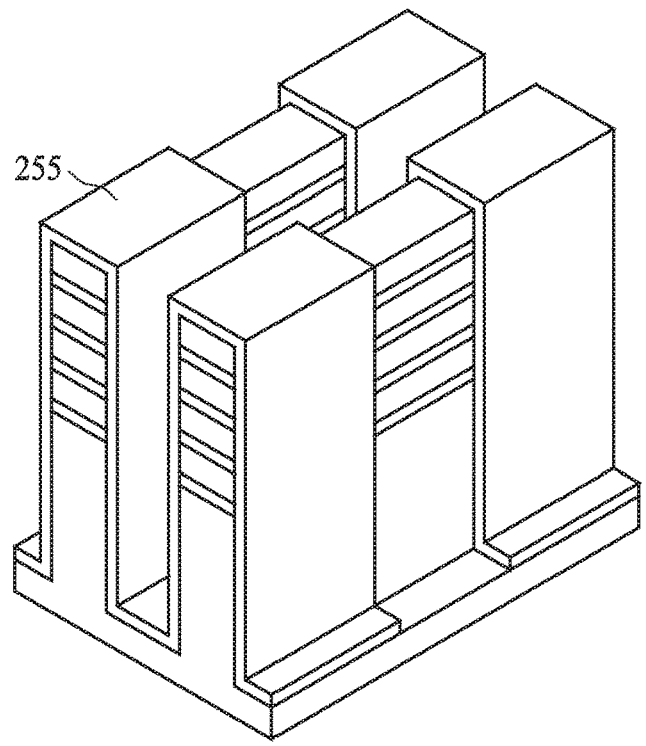
Figure 32E:
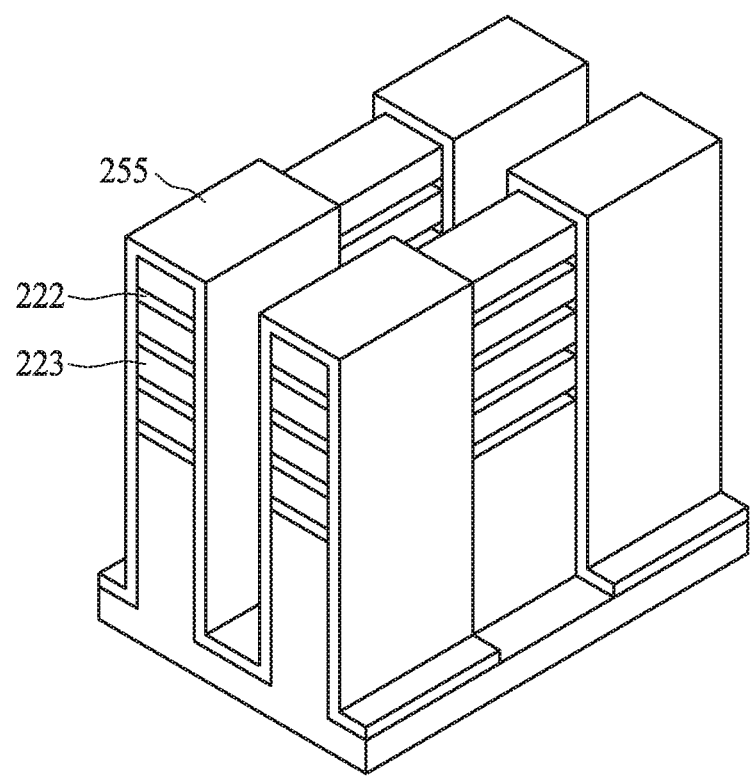

After the fin structure 235 is formed as shown in FIG. 32A, a blanket layer for the support structure 255 is formed as shown in FIG. 32B, and then a mask layer 256, such as a photo resist pattern, is formed as shown in FIG. 32C. Then, the blanket layer is etched to form the support structure 255 as shown in FIG. 32D. As shown in FIG. 32E, after the sacrificial layers and the second semiconductor layers 222 are removed, the ends of the fin structure are supported by the support structure 255.

In the embodiments of the present disclosure, an air spacer and/or an embedded insulating layer is disposed below the source and/or the drain diffusion regions and/or the gate electrode, and thus parasitic capacitance between the source/drain diffusion region and/or the gate electrode and the substrate can be suppressed or eliminated, which in turn can reduce power consumption and increase speed of the semiconductor device.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a field effect transistor (FET), a sacrificial region is formed in a substrate, and a fin structure is formed by patterning the substrate and the sacrificial region. A space is formed by at least partially etching the sacrificial region. An isolation insulating layer is over the substrate and an embedded insulating layer is formed by filling the space, with an insulating material, and a gate structure and a source/drain region are formed. In one or more of the foregoing and following embodiments, the sacrificial region is formed by an ion implantation operation. In one or more of the foregoing and following embodiments, ions of arsenic are implanted by the ion implantation operation. In one or more of the foregoing and following embodiments, a dose amount in the ion implantation operation is in a range from $5 \times 10^{13}$ ions/cm$^2$ to $5 \times 10^{15}$ ions/cm$^2$. In one or more of the foregoing and following embodiments, an acceleration voltage in the ion implantation operation is in a range from 0.5 keV to 10 keV. In one or more of the foregoing and following embodiments, the at least partially etching the sacrificial region comprises a dry etching operation using a chlorine containing gas. In one or more of the foregoing and following embodiments, the embedded insulating layer is located below an upper surface of the isolation insulating layer. In one or more of the foregoing and following embodiments, the at least partially etching the sacrificial region comprises a wet etching operation using a tetramethylammonium hydroxide (TMAH) aqueous solution. In one or more of the foregoing and following embodiments, the embedded insulating layer is connected to the isolation insulating layer. In one or more of the foregoing and following embodiments, an air spacer is formed in the embedded insulating layer. In one or more of the foregoing and following embodiments, the air spacer is fully enclosed by an insulating material of the embedded insulating layer. In one or more of the foregoing and following embodiments, an impurity containing region containing an impurity in an amount higher than the substrate is disposed between the space and the substrate.

In accordance with another aspect of the present disclosure, in a method of manufacturing a semiconductor device including an FET, a sacrificial region is formed in a substrate, first epitaxial semiconductor layers and second epitaxial semiconductor layers are formed alternatively over the substrate to form a stacked layer, and a fin structure is formed by patterning the stacked layer, the sacrificial region and a part of the substrate. A space is formed by at least partially etching the sacrificial region, an isolation insulating layer is formed over the substrate and an embedded insulating layer be filling the space, with an insulating material, a dummy gate structure and a source/drain region are formed, the dummy gate structure is removed to form a gate space, the first semiconductor layers are removed in the gate space, and a metal gate structure is formed over the second semiconductor layers in the gate space. In one or more of the foregoing and following embodiments, the sacrificial region is formed by an ion implantation operation. In one or more of the foregoing and following embodiments, an impurity amount of the sacrificial region is in a range from $1 \times 10^{19}$ atoms/cm$^3$ to $5 \times 10^{21}$ atoms/cm$^3$. In one or more of the foregoing and following embodiments, a thickness of the epitaxial semiconductor layer is in a range from 5 nm to 100 nm. In one or more of the foregoing and following embodiments, the embedded insulating layer includes an air spacer, and a width of the air spacer varies along the first direction in plan view. In one or more of the foregoing and following embodiments, the embedded insulating layer includes an air spacer, and the air spacer is discontinuous under the source/drain region along the first direction in plan view.

In accordance with another aspect of the present disclosure, a semiconductor device includes a Fin FET. The FinFET includes a semiconductor fin structure disposed over a bottom fin structure provided over a substrate, an isolation insulating layer disposed over the substrate, a gate dielectric layer disposed over a channel region of the semiconductor fin structures, a gate electrode disposed over the gate dielectric layer, a source and a drain disposed adjacent to the channel region, and an embedded insulating layer disposed between a bottom of the fin structure and a top of the bottom fin structure, and continuously made of a same material as the isolation insulating layer. In one or more of the foregoing and following embodiments, the embedded insulating layer is continuously disposed under the channel region and a source/drain region of the fin structure. In one or more of the foregoing and following embodiments, an air spacer is formed in the embedded insulating layer. In one or more of the foregoing and following embodiments, the air spacer is fully enclosed by an insulating material of the embedded insulating layer. In one or more of the foregoing and following embodiments, an impurity containing region containing an impurity in an amount higher than the bottom fin structure is disposed between the embedded insulating layer and the bottom fin structure.

In accordance with another aspect of the present disclosure, a semiconductor device includes semiconductor wires disposed over a bottom fin structure provided over a substrate, an isolation insulating layer disposed over the substrate, a gate dielectric layer wrapping around a channel region of each of the semiconductor wires, a gate electrode disposed over the gate dielectric layer, a source and a drain disposed adjacent to the channel region, and an embedded insulating layer disposed below the semiconductor wires, and continuously made of a same material as the isolation insulating layer. In one or more of the foregoing and following embodiments, an air spacer is formed in the embedded insulating layer. an impurity containing region containing an impurity in an amount higher than the bottom fin structure is disposed between the embedded insulating layer and the bottom fin structure.

The foregoing outlines features of several embodiments or examples so that those skilled in the art may better understand the aspects of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a field effect transistor (FET), the method comprising:
   forming a sacrificial region in a substrate;
   forming a semiconductor layer over the sacrificial region;
   forming a fin structure by patterning the substrate, the semiconductor layer and the sacrificial region;
   forming a space below the patterned semiconductor layer by at least partially removing the sacrificial region;
   forming an isolation insulating layer over the substrate and an embedded insulating layer by filling the space, with an insulating material; and
   forming a gate structure and a source/drain region.

2. The method of claim 1, wherein the sacrificial region is formed by an ion implantation operation into the substrate.

3. The method of claim 2, wherein ions of arsenic are implanted by the ion implantation operation.

4. The method of claim 2, wherein a dose amount in the ion implantation operation is in a range from $5 \times 10^{13}$ ions/cm$^2$ to $5 \times 10^{15}$ ions/cm$^2$.

5. The method of claim 2, wherein an acceleration voltage in the ion implantation operation is in a range from 0.5 keV to 10 keV.

6. The method of claim 1, wherein the at least partially etching the sacrificial region comprises a dry etching operation using a chlorine containing gas.

7. The method of claim 1, wherein the embedded insulating layer is located below an upper surface of the isolation insulating layer.

8. The method of claim 7, wherein the at least partially etching the sacrificial region comprises a wet etching operation using a tetramethylammonium hydroxide (TMAH) aqueous solution.

9. The method of claim 1, wherein the embedded insulating layer is connected to the isolation insulating layer.

10. The method of claim 1, wherein an air spacer is formed in the embedded insulating layer.

11. The method of claim 10, wherein the air spacer is fully enclosed by an insulating material of the embedded insulating layer.

12. The method of claim 1, wherein an impurity containing region containing an impurity in an amount higher than the substrate is disposed between the space and the substrate.

13. A semiconductor device including a Fin FET, comprising:
    a semiconductor fin structure disposed over a bottom fin structure provided over a substrate;
    an isolation insulating layer disposed over the substrate;
    a gate dielectric layer disposed over a channel region of the semiconductor fin structure;
    a gate electrode disposed over the gate dielectric layer;
    a source and a drain disposed adjacent to the channel region; and
    an embedded insulating layer disposed between a bottom of the semiconductor fin structure and a top of the bottom fin structure, and continuously made of a same material as the isolation insulating layer,
    wherein an impurity containing region containing an impurity in an amount higher than the bottom fin structure is disposed between the embedded insulating layer and the bottom fin structure.

14. The semiconductor device of claim 13, wherein the embedded insulating layer is continuously disposed under the channel region and a source/drain region of the semiconductor fin structure.

15. The semiconductor device of claim 13, wherein an air spacer is formed in the embedded insulating layer.

16. The semiconductor device of claim 15, wherein the air spacer is fully enclosed by an insulating material of the embedded insulating layer.

17. The semiconductor device of claim 13, wherein the embedded insulating layer fully fills a region between the bottom of the semiconductor fin structure and the top of the bottom fin structure.

18. A semiconductor device including an FET, comprising:
    semiconductor wires disposed over a bottom fin structure provided over a substrate;
    an isolation insulating layer disposed over the substrate;
    a gate dielectric layer wrapping around a channel region of each of the semiconductor wires;
    a gate electrode disposed over the gate dielectric layer;
    a source and a drain disposed adjacent to the channel region of each of the semiconductor wires; and
    an embedded insulating layer disposed below the semiconductor wires, and continuously made of a same material as the isolation insulating layer,
    wherein an impurity containing region containing an impurity in an amount higher than the bottom fin structure is disposed between the embedded insulating layer and the bottom fin structure.

19. The semiconductor device of claim 18, wherein an air spacer is formed in the embedded insulating layer.

20. The semiconductor device of claim 18, wherein the embedded insulating layer fully fills a region between a bottom of a bottommost one of the semiconductor wires and a top of the bottom fin structure.

* * * * *